(12) United States Patent
Katagiri

(10) Patent No.: US 8,402,424 B2
(45) Date of Patent: Mar. 19, 2013

(54) SUPPORT APPARATUS, CONTROL METHOD, AND CONTROL PROGRAM

(75) Inventor: Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/185,107

(22) Filed: Jul. 18, 2011

(65) Prior Publication Data

US 2012/0030640 A1    Feb. 2, 2012

(30) Foreign Application Priority Data

Aug. 2, 2010   (JP) ................................. 2010-173649

(51) Int. Cl.
    G06F 17/50   (2006.01)
(52) U.S. Cl. ........................................ 716/139; 716/119
(58) Field of Classification Search .......... 716/118–125, 716/139
    See application file for complete search history.

(56) References Cited

U.S. PATENT DOCUMENTS

| 2004/0153988 A1* | 8/2004 | Ito et al. ........................... 716/11 |
| 2005/0235239 A1* | 10/2005 | Matsubara ....................... 716/10 |
| 2008/0276213 A1* | 11/2008 | Aoki et al. ....................... 716/13 |

FOREIGN PATENT DOCUMENTS

| JP | 8-96012 A | 4/1996 |
| JP | 2000-67101 A | 3/2000 |

* cited by examiner

Primary Examiner — Binh Tat
(74) Attorney, Agent, or Firm — Fujitsu Patent Center

(57) ABSTRACT

A design support apparatus that supports designing of a circuit and is connected to a display unit, the design support apparatus includes a storage unit that stores logical connection information of the circuit and cell information of a plurality of cells included in the circuit, a selection unit that selects target cell information of a cell to be placed out of the cell information stored in the storage unit, a placement unit that provisionally places the cell corresponding to the selected target cell information based on inputted positional information, a determination unit that determines whether a wiring mode is set, a wiring unit that provisionally arranges wiring connected to the provisionally placed cell when the determination unit determines that the wiring mode is set, and a finalization unit that finalizes a position of the wiring provisionally arranged based on finalization of a position of the cell provisionally placed.

11 Claims, 19 Drawing Sheets

FIG. 17
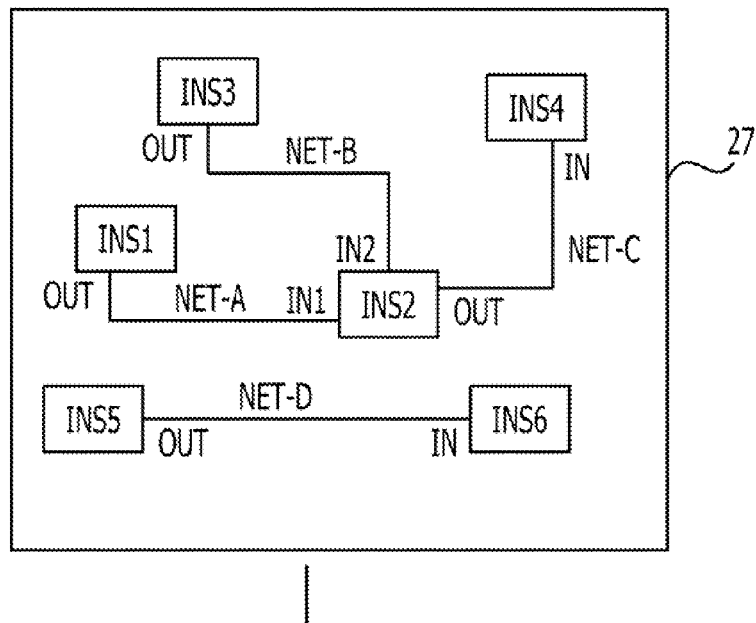
INDIVIDUAL-NET-SETTING DISPLAY SCREEN
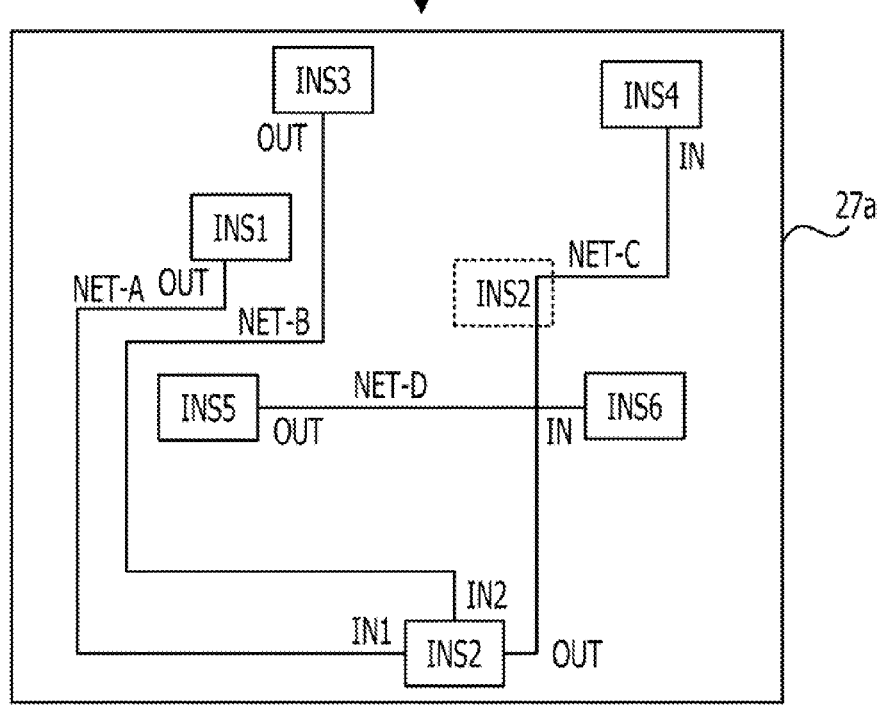

SUPPORT APPARATUS, CONTROL METHOD, AND CONTROL PROGRAM

CROSS-REFERENCE TO RELATED APPLICATIONS

This application is based upon and claims priority to prior Japanese Patent Application No. 2010-173649 filed on Aug. 2, 2010 in the Japan Patent Office, the entire contents of which are incorporated herein by reference.

FIELD

The embodiments discussed herein relate to a design support apparatus, a control method, and a control program.

BACKGROUND

In physical design of a semiconductor integrated circuit such as a LSI (Large Scale Integrated circuit), there is a known technology regarding a design support apparatus (CAD (Computer Aided Design) apparatus) for performing automatic wiring upon movement of a circuit block on a screen displayed on a monitor.

Regarding the automatic wiring, the following technique is known. That is, regarding a net (a connection (logical connection) between terminals in a circuit) for which wiring is to be performed, or between the terminals, after the terminals included in the net or a cell (a circuit component serving as a unit for placement in physical design) having the terminals is placed, an instruction for performing automatic wiring in the net or between the terminals is given, and as a result, wiring is performed so that the wiring is completed.

Also, a technique for determining in real time, whether wiring has to be repaired while visually checking the wiring on a screen is known.

In these techniques, an explicit instruction for performing automatic wiring is given after terminals included in a net or a cell having terminals has been placed. Therefore, there have been problems in that an instruction for performing automatic wiring cannot be given unless placement of the cell is completed, and in addition that whenever the wiring result is not suitable because of the placement position of the cell, an instruction for placing the cell again and performing wiring again needs to be given which makes the procedure complicated.

In consideration of such a point, an object of the invention is to provide a design support apparatus and a control method for the purpose of efficient wiring.

[Patent Document 1] Japanese Laid-open Patent Publication No. 8-96012

[Patent Document 2] Japanese Laid-open Patent Publication No. 2000-67101

SUMMARY

According to an aspect of the invention, a design support apparatus that supports designing of a circuit and is connected to a display unit, the design support apparatus includes a storage unit that stores logical connection information of the circuit and cell information of a plurality of cells included in the circuit, a selection unit that selects target cell information of a cell to be placed out of the cell information stored in the storage unit, a placement unit that provisionally places the cell corresponding to the selected target cell information based on inputted positional information, a determination unit that determines whether a wiring mode is set, a wiring unit that provisionally arranges wiring connected to the provisionally placed cell when the determination unit determines that the wiring mode is set, and a finalization unit that finalizes a position of the wiring provisionally arranged based on finalization of a position of the cell provisionally placed.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 17 illustrates an operation example of the placement processing unit in the case of selecting a priority wiring mode on a net-by-net basis;

DESCRIPTION OF EMBODIMENTS

Embodiments will be described in detail below with reference to the accompanying drawings.

A design support apparatus of an embodiment will first be described, and then this embodiment will be described more specifically.

First Embodiment

Figure 1:
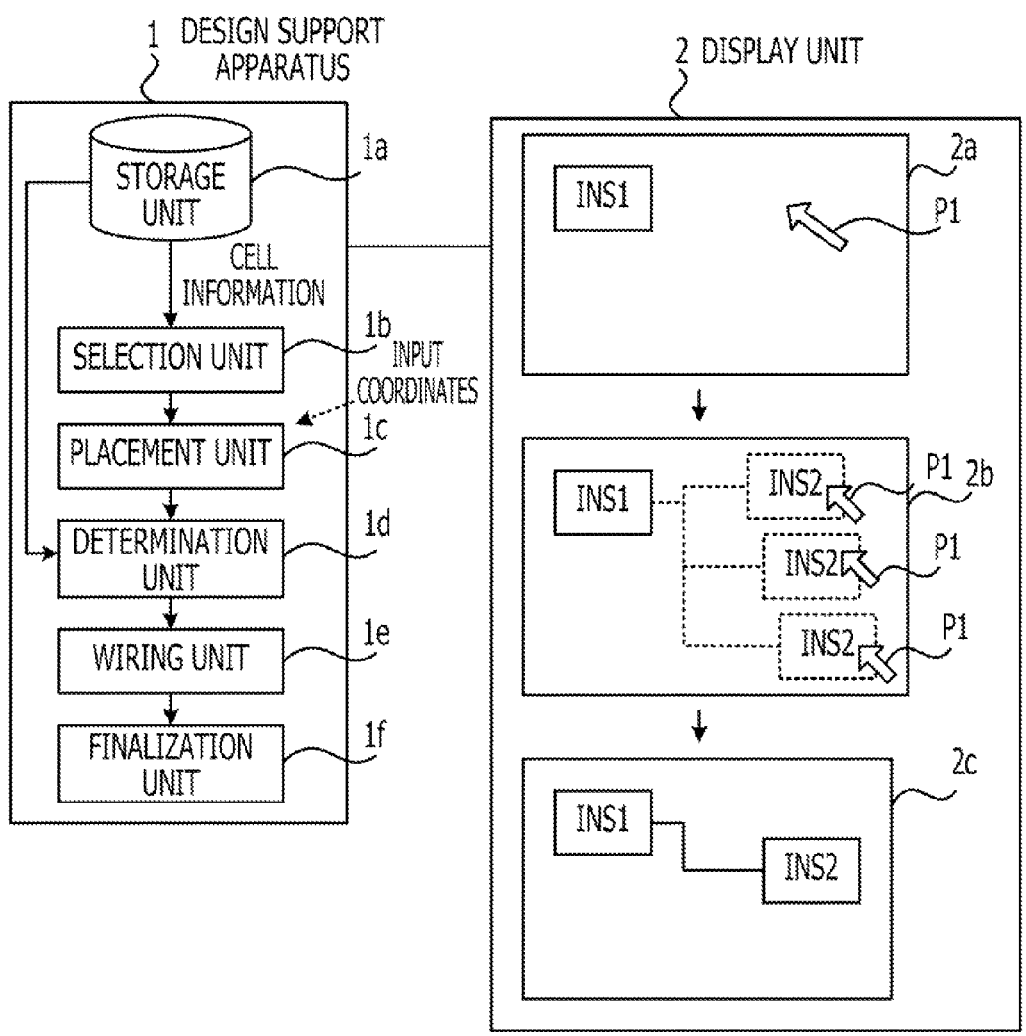
FIG. 1 illustrates an outline of a design support apparatus of a first embodiment.

FIG. 1 illustrates an outline of a design support apparatus of a first embodiment.

A design support apparatus (e.g., a computer) 1 of the embodiment is connected to a display unit 2, and includes a storage unit 1a, a selection unit 1b, a placement unit 1c, a determination unit 1d, a wiring unit 1e, and a finalization unit 1f.

The storage unit 1a stores logical connection information (e.g., net list and net information) of a circuit and cell information of cells to be placed.

The selection unit 1b selects cell information of a cell to be placed out of the cell information stored in the storage unit 1a. In this embodiment, an instance Ins2 is assumed to be the cell to be placed. The substance of a cell to be placed can be identified by an instance. The selection unit 1b selects the cell information of the instance Ins2.

The placement unit 1c provisionally places the cell of the selected cell information on the basis of input positional information.

Here, placed on a screen 2a is an instance Ins1 of which position is determined in advance.

A user can input positional information (e.g., coordinates) by using a mouse and a keyboard while viewing the screen 2a displayed on the display unit 2. In the screen 2a, a pointer P1 of a mouse is illustrated as an example. For example, the placement unit 1c can recognize the position of the tip of the pointer P1 as positional information.

Also, the selected instance Ins2 is provisionally placed as illustrated in a screen 2b when a user stops a mouse on the screen 2a for a predetermined time, for example. It is to be noted that, the provisionally placed instance Ins2 is indicated by a dotted line in FIG. 1. At the time when the instance Ins2 is provisionally placed, wiring is not displayed.

The screens 2a to 2c each displays transitions of processing of the design support apparatus 1 and display of the display unit 2, and these screens 2a to 2c need not appear simultaneously on the display unit 2, respectively.

The determination unit 1d determines whether a wiring mode is in use. Information indentifying the wiring mode and the like can be predetermined and stored in the storage unit 1a by a user, for example.

If the determination unit 1d determines that the wiring mode is in use, the wiring unit 1e performs provisional wiring for wiring connected to the provisionally placed cell. As illustrated in the screen 2b, provisional wiring is performed between the instance Ins1 and the instance Ins2. As the position at which the instance Ins2 is provisionally placed changes, the position at which provisional wiring is arranged changes.

Based on finalization of a position at which the cell is provisionally placed, the finalization unit 1f finalizes the position at which provisional wiring arranged for the cell is placed.

This finalization of the placement position of the cell can be performed by a user clicking with a mouse, for example. As a result, the instance Ins2 is placed at the determined position as illustrated in the screen 2c. Wiring connecting the placed instance Ins2 to the instance Ins1 is also placed.

With such an apparatus as the design support apparatus 1, wiring is completed after the instance Ins2 has been placed, and therefore an explicit instruction for performing wiring need not be given after the placement of the instance Ins2. This allows for the work of a designer to be saved.

The arrangement of wiring is displayed before the placement of the instance Ins2. The arrangement of wiring can therefore be confirmed while placement of the wiring is under examination. This allows for the work of a designer to be saved.

It is to be noted that the selection unit 1b, the placement unit 1c, the determination unit 1d, the wiring unit 1e, and the finalization unit 1f can be implemented by functions included in a CPU (Central Processing Unit) of the design support apparatus 1 includes. The storage unit 1a can be implemented by a data storage area included in a RAM (Random Access Memory), a HDD (Hard Disk Drive), or the like that the design support apparatus 1 includes.

In the following, this embodiment will be described more specifically.

Second Embodiment

Figure 2:
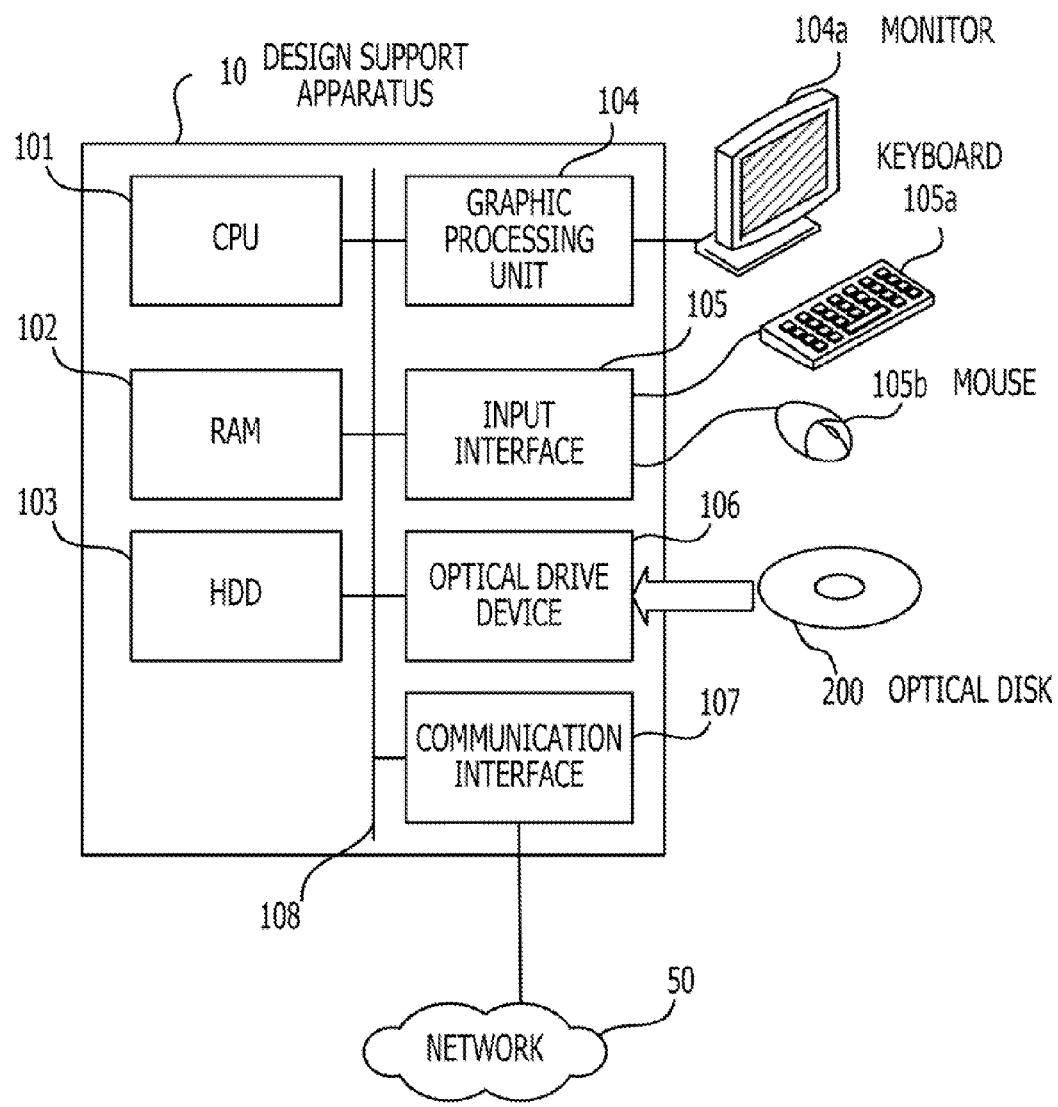
FIG. 2 illustrates a configuration example of hardware of a design support apparatus of a second embodiment.

FIG. 2 illustrates a configuration example of hardware of a design support apparatus of a second embodiment.

In the design support apparatus 10, the entire apparatus is controlled by a CPU 101. A RAM 102 and a plurality of peripheral devices are connected to the CPU 101 though a bus 108.

The RAM 102 is used as a main storage device of the design support apparatus 10. At least part of an operating system (OS) program and application programs such as a CAD program to be executed by the CPU 101 is stored in the RAM 102. Various data required for processing by the CPU 101 is also stored in the RAM 102.

The peripheral devices connected to the bus 108 include, for example, a HDD 103, a graphic processing unit 104, an input interface 105, an optical drive device 106, and a communication interface 107.

The HDD 103 writes and reads data to and from an integrated disc magnetically. The HDD 103 is used as a secondary storage device of the design support apparatus 10. An OS program, application programs such as a CAD program, and various data are stored in the HDD 103. It is to be noted that semiconductor storage devices such as a flash memory may be used as the secondary storage device.

A monitor 104a is connected to the graphic processing unit 104. The graphic processing unit 104 displays an image on a screen of the monitor 104a, according to an instruction from the CPU 101. Examples of the monitor 104a include display devices using CRT (cathode ray tubes), and LCD (liquid crystal display devices).

A keyboard 105a and a mouse 105b are connected to the input interface 105. The input interface 105 transmits signals from the keyboard 105a and the mouse 105b to the CPU 101. It is to be noted that the mouse 105b is an exemplary pointing device, and other pointing devices may be used. Other pointing devices include touch panels, tablets, touch pads, and track balls, for example.

The optical drive device 106 reads data recorded on an optical disc 200 utilizing a laser light beam. The optical disc 200 is a portable recording medium on which data is recorded so as to be able to be read using the reflection of a light beam. Examples of the optical disc 200 include a DVD (Digital Versatile Disc), a DVD-RAM, a CD-ROM (Compact Disc Read Only Memory), and a CD-R (Recordable)/RW (Re-Writable).

The communication interface 107 is connected to a network 50. The communication interface 107 transmits and receives data over the network 50 to and from other computers or communication devices.

With a hardware configuration as described above, processing functions of this embodiment can be implemented.

The following functions are provided in the design support apparatus 10 having such a hardware configuration as described above.

Figure 3:
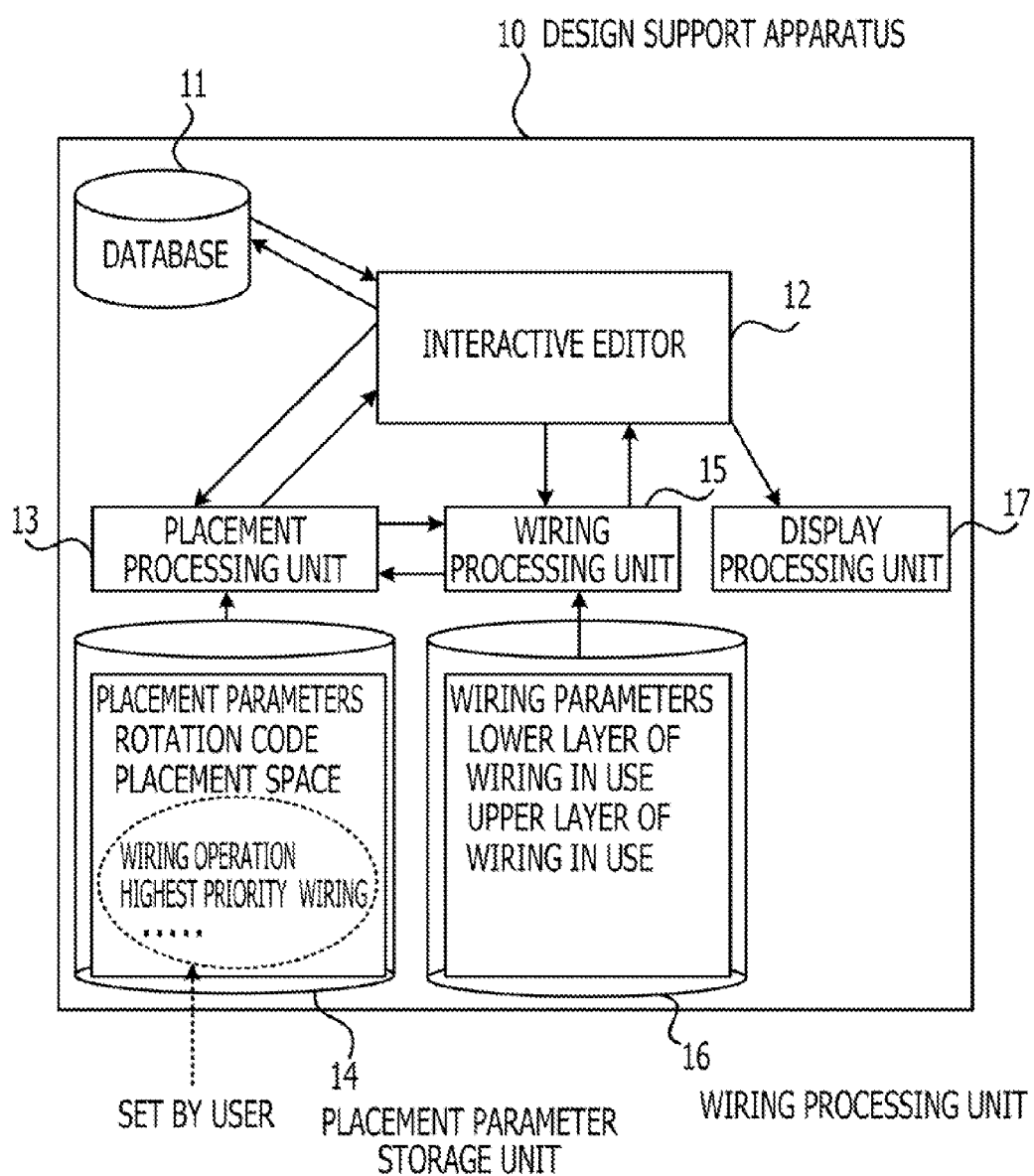
FIG. 3 is a block diagram illustrating functions of the design support apparatus of the second embodiment.

FIG. 3 is a block diagram illustrating functions of the design support apparatus of the second embodiment.

The design support apparatus 10 includes a database 11, an interactive editor 12, a placement processing unit 13, a placement parameter storage unit 14, a wiring processing unit 15, a wiring parameter storage unit 16, and a display processing unit 17.

Stored in the database 11 are logical connection information (e.g., a net list and net information), cell library information, instance information, wiring rule information, placement information, wiring information, user instruction information, and the like.

Upon receiving display data on real wiring that is not finalized (hereinafter referred to as "unfinalized real wiring") from the placement processing unit 13, the interactive editor 12 instructs the display processing unit 17 to display the unfinalized real wiring on the monitor 104a in such a form (e.g., in a dotted line) as to be distinguishable from finalized wiring.

Upon receiving a request transmitted from the placement processing unit 13 for logical connection information displaying, the interactive editor 12 reads the logical connection information from the database 11 and instructs the display processing unit 17 to display the read information on the monitor 104a.

The placement processing unit 13 reads in a placement parameter file indicated by a user that is stored in the placement parameter storage unit 14. Then, the placement processing unit 13 confirms whether a wiring mode has been specified in the parameter file indicated by the user. If the wiring mode has been specified in the parameter file, the placement processing unit 13 calls the wiring processing unit 15 so that wiring processing is performed. Then, the placement processing unit 13 transmits data as a wiring result for display on the unfinalized real wiring to the interactive editor 12. On the other hand, if the wiring mode has not been specified, the placement processing unit 13 requests the interactive editor 12 to display logical connection information on the monitor 104a.

Further, if an instruction for finalizing a placement position is given, the placement processing unit 13 finalizes placement coordinates and a wiring path.

Here, an instruction for finalizing a placement position can be given by a user clicking with a mouse, for example.

In the placement parameter storage unit 14, parameters regarding placement such as a rotation code and a placement space are stored. A placement parameter file specified by a user is also stored.

The wiring processing unit 15 is called by the placement processing unit and performs wiring processing.

In the wiring parameter storage unit 16, parameters regarding wiring are stored. FIG. 3 illustrates the case where a lower layer of wiring in use which is wiring of a lower layer of a double-layer substrate, and an upper layer of wiring in use which is wiring of an upper layer of the double-layer substrate, are stored.

The display processing unit 17 displays information transmitted from the interactive editor 12 on the monitor 104a.

The processing of the placement processing unit 13 will be described next in detail.

Figure 4:
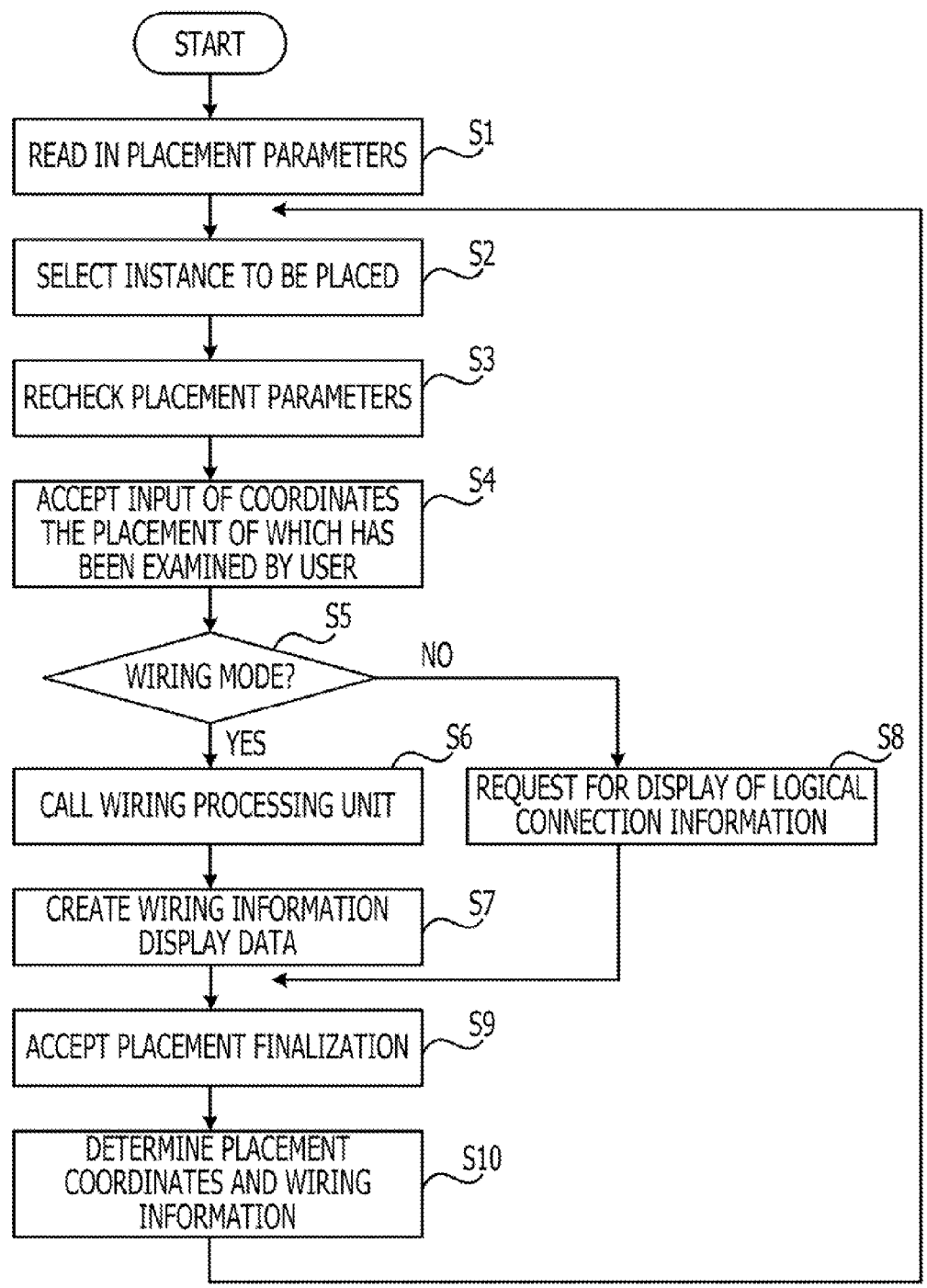
FIG. 4 is a flowchart illustrating processing of a placement processing unit.

FIG. 4 is a flowchart illustrating processing of the placement processing unit.

[Step S1] The placement processing unit 13 reads in a placement parameter file stored in the placement parameter storage unit 14. Then, the process goes to step S2.

[Step S2] The placement processing unit 13 selects an instance to be placed. Then, the process goes to step S3.

[Step S3] The placement processing unit 13 rechecks changes of placement parameters. Then, the process goes to step S4.

[Step S4] The placement processing unit 13 accepts input of coordinates for the selected instance, the placement of which has been examined by the user. For example, the placement processing unit 13 can recognize the position at the tip of the pointer of the mouse 105b as the coordinates. Then, the process goes to step S5.

[Step S5] Referring to the placement parameter file, the placement processing unit 13 determines whether the mode specified by the user is a wiring mode or not. If the specified mode is the wiring mode (Yes in step S5), then the process moves to step S6. If the specified mode is not the wiring mode (No in step S5), then the process moves to step S8.

[Step S6] The placement processing unit 13 calls the wiring processing unit 15. Then, the process goes to step S7.

[Step S7] The placement processing unit 13 causes wiring processing to be performed by the wiring processing unit 15. Data of a wiring result for display on unfinalized real wiring, is created. Then, the process goes to step S9.

[Step S8] The placement processing unit 13 transmits a request for displaying logical connection information to the interactive editor 12. Then, the process goes to step S9.

[Step S9] The placement processing unit 13 accepts that the user has finalized the placement of the instance being placed (finalization of the placement position). Then, the process goes to step S10.

[Step S10] Upon accepting the finalization of the placement position, the placement processing unit 13 determines placement coordinates. In step with the determination of the placement coordinates, the placement processing unit 13 registers the unfinalized real wiring information created in step S6 as information on real wiring. Then, the process returns to step S2.

Thus, the description of processing of the placement processing unit 13 is completed.

It is to be noted that processing of step S4 is performed after processing of step S3; however, this is not restrictive, and the processing of step S3 may be performed after the processing of step S4 in FIG. 4.

Next, parameters that a user sets will be described.

Figure 5:
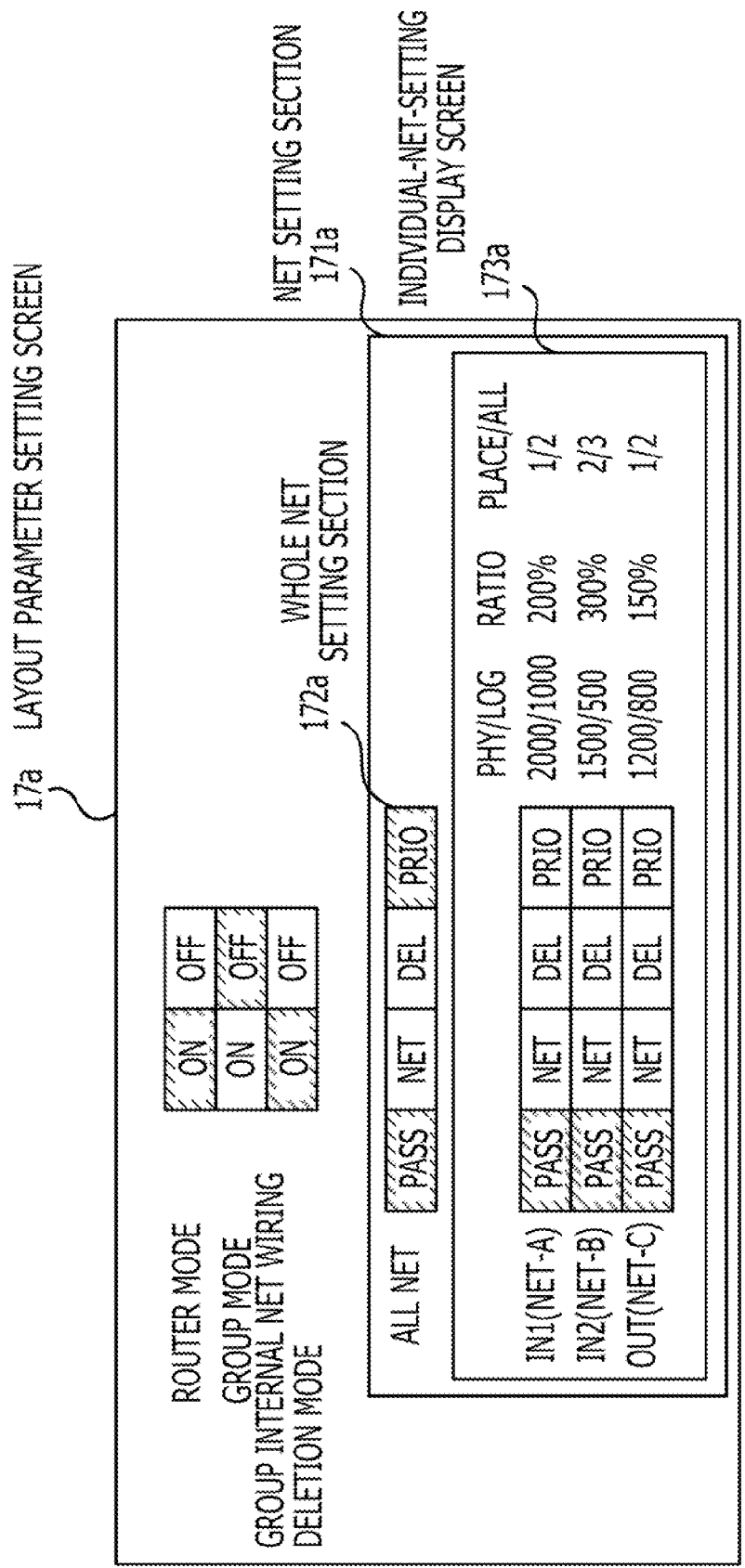
FIG. 5 illustrates parameters that a user sets.

FIG. 5 illustrates parameters that a user sets.

In a placement parameter setting screen 17a illustrated in FIG. 5, parameters including modes that can be set by a user are displayed. Items that have been set on the placement parameter setting screen 17a are stored in the placement parameter file.

It is to be noted that settings are indicated by oblique lines by way of example in FIG. 5.

A user can set a router mode (Router Mode), a group mode (Group Mode), and a group internal net wiring deletion mode (Group Int. Delete).

In the case where the router mode is set to ON, the placement processing unit 13 causes wiring to be displayed from the time of a placement task (step S6 described above) and creates wiring simultaneously with finalization of a placement position.

In the case where the router mode is set to OFF, logical connection information is represented in line during the placement task of the placement processing unit 13. Wiring is not created simultaneously with the finalization of the placement position.

Thus, a user can prevent the design support apparatus 10 from performing wiring by setting the router mode to OFF in cases where wiring need not be created, such as the case of initial placement.

In the case where the group mode is set to ON, the placement processing unit 13 creates wiring simultaneously with finalization of a placement position.

In the case where the group mode is set to OFF, the placement processing unit 13 does not create wiring at the time of the finalization of the placement position.

Thus, a user can prevent wiring from being created by setting the group mode to OFF in cases where wiring need not be created, such as the case where it is difficult for a user to visually confirm wiring even if the wiring is created using group placement.

In the case where the group internal net wiring deletion mode is set to ON, the placement processing unit 13 deletes wiring of a net that is closed in a group, simultaneously with finalization of a placement position.

In the case where the group internal net wiring deletion mode is set to OFF, the placement processing unit 13 leaves intact the wiring of the net closed in the group without deleting the wiring at the time of the finalization of the placement position.

A user sets the group internal net wiring deletion mode to OFF, when wanting to delete the existing wiring, and when wanting to arrange new wiring at the time of moving a cell identified by an instance to a different location, for example. This enables control over wiring of a net closed in a group at the time of cell movement.

A user can set a pass mode (pass Mode) and a net mode (net Mode) and can also set a deletion mode (del Mode) and a priority wiring mode (priority Mode).

There is a toggle relation between the pass mode and the net mode. While either one is set, the other is not set (not selected). Other modes are independent of each other, and whether any of them is set or not can be individually determined.

This function enables control over creation of wiring while placing instances by net or by pass.

This setting can be performed collectively for all nets, and can also be performed on a net-by-net basis by using a net setting section 171a.

When the setting is performed collectively for all the nets by using an all net setting section 172a.

The setting on a net-by-net basis can be performed on a layout screen that will be described later. Setting performed on the layout screen is displayed (reflected) on the individual-net-settings display screen 173a.

Here, in a field of Phy/Log of the individual-net-settings display screen 173a, a Manhattan distance and a real wiring length are set in this order. The Manhattan distance represents the length obtained by totaling a difference in X coordinate value and a difference in Y coordinate value between two points connected by the net in question. The real wiring length represents the length of real wiring or provisional wiring.

In a field of Ratio, the percentage (%) of the real wiring length with respect to the Manhattan distance is set.

In a field of Place/ALL, the number of cells placed in the net is set. The "Place" represents the number of cells being currently placed. The "ALL" represents the number of cells to be placed.

These numerical values dramatically vary during search for a candidate position for placement of an instance, for example. This enables these numerical values to be used as guides at the time of determining a placement position, so that an instance can be placed at an intended position more accurately.

Setting modes on a net-by-net basis makes it possible to control creation of wiring on the net-by-net basis for nets connected to terminals of a cell placed for the creation of wiring. Whether the highest priority wiring is made or not can thus be controlled by net or by pass.

Figure 6:
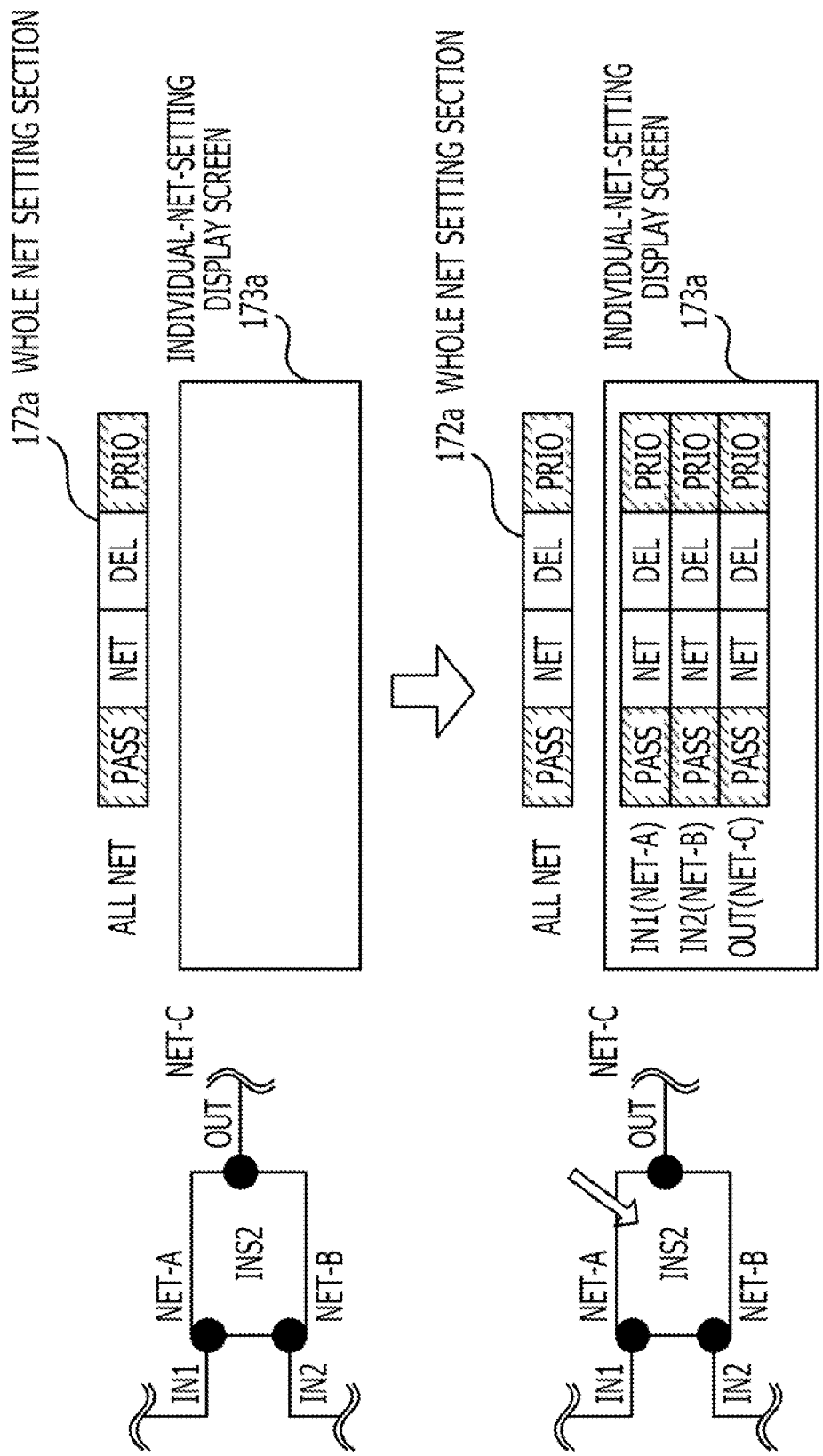
FIG. 6 illustrates an exemplary setting method on a net-by-net basis.

FIG. 6 illustrates an exemplary setting method on a net-by-net basis.

The instance Ins2 illustrated in FIG. 6 is a cell having the two input terminals In1 and In2 and one output terminal Out. When this cell is moved, wiring corresponding to three nets (Net-A, Net-B, and Net-C) exists.

When a user has selected the instance Ins2 as a cell to be moved, the display processing unit 17 dramatically displays parameters for nets existing in the cell on the individual-net-settings display screen 173a based on a request from the placement processing unit 13.

The default values of the parameters are values set in the all net setting section 172a. When a user performs operation for settings of the all net setting section 172a, the placement processing unit 13 changes settings of all nets displayed on the individual-net-settings display screen 173a according to the settings of the all net setting section 172a.

For example, when the priority wiring mode is set to OFF in the all net setting section 172a, all the priority wiring modes of the individual-net-settings display screen 173a change from ON to OFF. If it is desired that an operation change be performed on a terminal-by-terminal (net-by-net) basis, the change is specified by on the net-by-net basis.

Operation of the placement processing unit 13 upon selection of these modes will next be described.

In the following, specific examples of operation of the placement processing unit 13 in modes set on the placement parameter setting screen 17a will be described.

It is to be noted that specific examples of operation of the placement processing unit 13 in the case where an instance is placed on a substrate of a single wiring layer will be described in the following description except for the case illustrated in FIG. 14.

Figure 7:
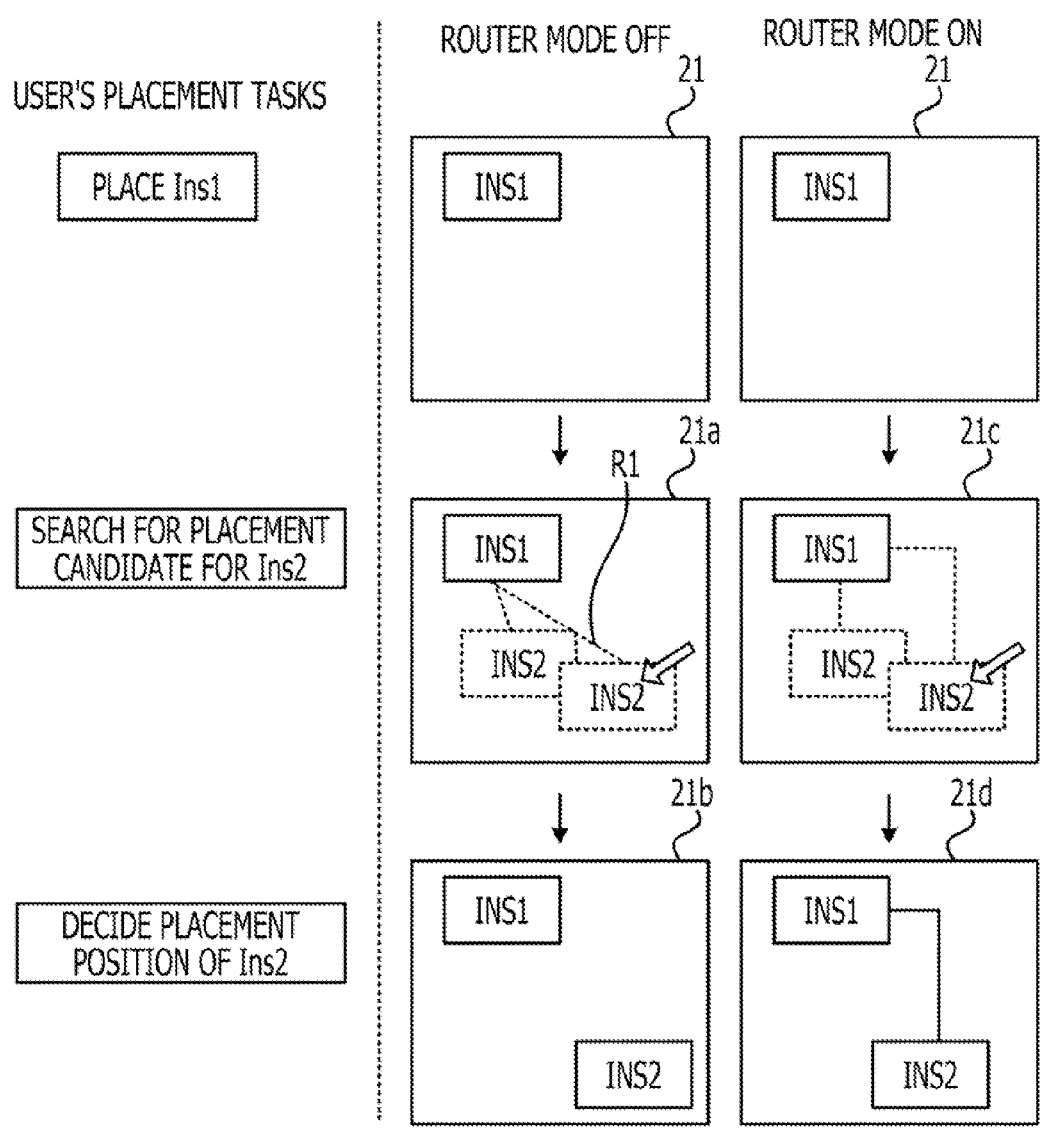
FIG. 7 illustrates differences of operation of the placement processing unit between the states of a router mode that is set.

FIG. 7 illustrates differences of operation of the placement processing unit between the setting states of the router mode.

The left side from a dotted line illustrates placement tasks that a user performs. The right side illustrates instances displayed on the layout screen.

For the convenience of description with reference to FIG. 7, assume that "Net-A (Ins1, Ins2)" is mentioned in the net list.

A circuit block 21 displayed on a layout screen represents a state in which the instance Ins1 is placed.

In the case where the router mode is set to OFF, the placement processing unit 13 displays a line corresponding to logical connection information that represents logical connection.

In FIG. 7, the instance Ins2 is illustrated as a candidate for placement. As illustrated in a circuit block 21a, the placement processing unit 13 displays logical connection information R1 representing the shortest distance between the instance Ins2 and the instance Ins1 regardless of real wiring when a user changes the placement of the instance Ins2.

As illustrated in a circuit block 21b, in the case where the router mode is set to OFF, the placement processing unit 13 does not create wiring after a user has finalized the placement position of the instance Ins2. This way enables the control in such a manner that wiring is not created in cases where wiring need not be created, such as the case of initial placement.

On the other hand, in the case where the router mode is set to ON, the placement processing unit 13 displays provisional wiring at a position where wiring is really arranged from the time of the placement task.

As illustrated in a circuit block 21c, provisional wiring between the instance Ins2 and the instance Ins1 is displayed at a position where wiring is really arranged when a user changes the placement of the instance Ins2. It is to be noted that, provisional wiring is indicated by a dotted line in FIG. 7.

As illustrated in a circuit block 21d, the placement processing unit 13 finalizes the displayed provisional wiring at the moment when a user finalizes the placement position of the instance Ins2 in the case where the router mode is set to ON. As such, wiring can be completed at the instant when the final cell in the net is placed in the case where the router mode is set to ON.

Figure 8:
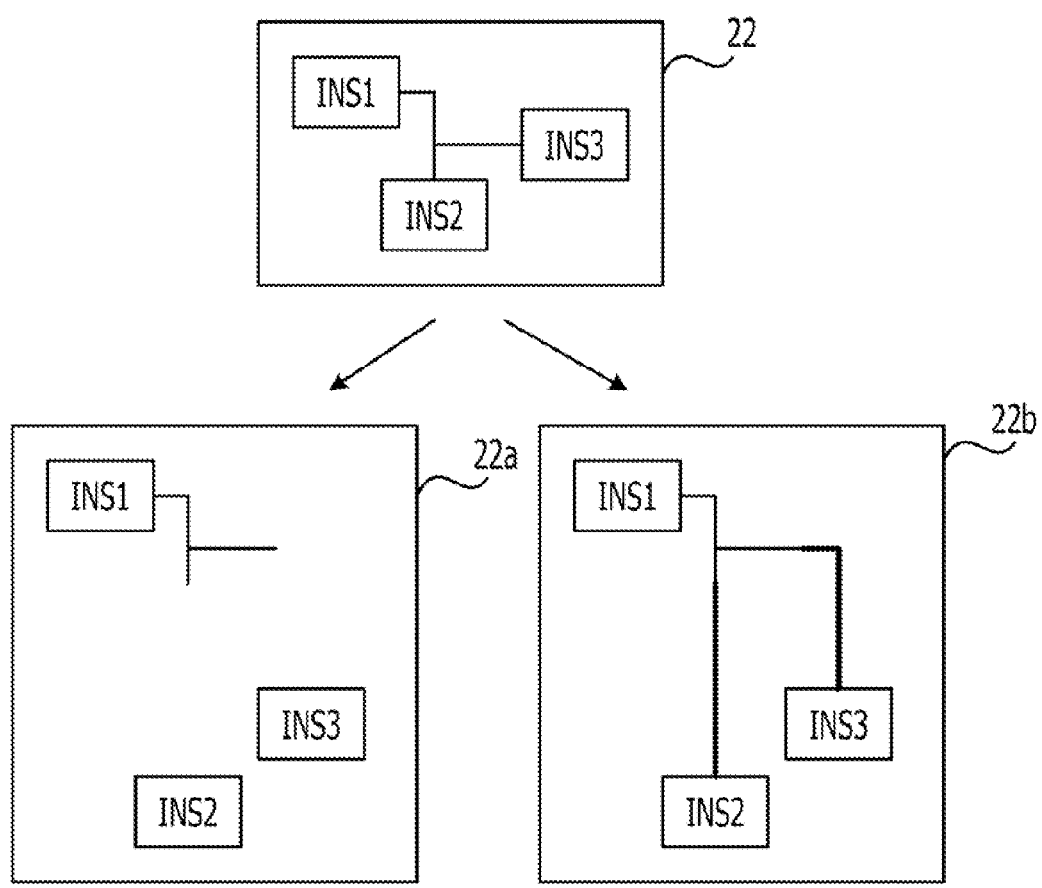
FIG. 8 illustrates a difference of operation of the placement processing unit between the states of a group mode that is set.

FIG. 8 illustrates a difference of operation of the placement processing unit between the setting states of the group mode.

For the convenience of description with reference to FIG. 8, it is assumed that "Net-A (Ins1, Ins2, Ins3)" is mentioned in the net list.

Circuit blocks 22a and 22b represent a difference of operation of the placement processing unit 13 between the setting states of the group mode when a user collectively moves the instance Ins2 and an instance Ins3 in a circuit block 22.

The circuit block 22a represents a processing result in the case where the group mode is set to OFF. In the case where the group mode is set to OFF, the placement processing unit 13 does not create wiring after a user has finalized the placement positions of the instances Ins2 and Ins3. This way enables the control in such a manner that wiring is not created in cases where wiring need not be created, such as the case where it is difficult for a user to visually confirm wiring even if the wiring is created using group placement.

The circuit block 22b represents a processing result in the case where the group mode is set to ON. In the case where the group mode is set to ON, the placement processing unit 13 creates new wiring at the moment when the placement position is finalized, so that the instance Ins1 is connected with the instances Ins2 and Ins3.

Figure 9:
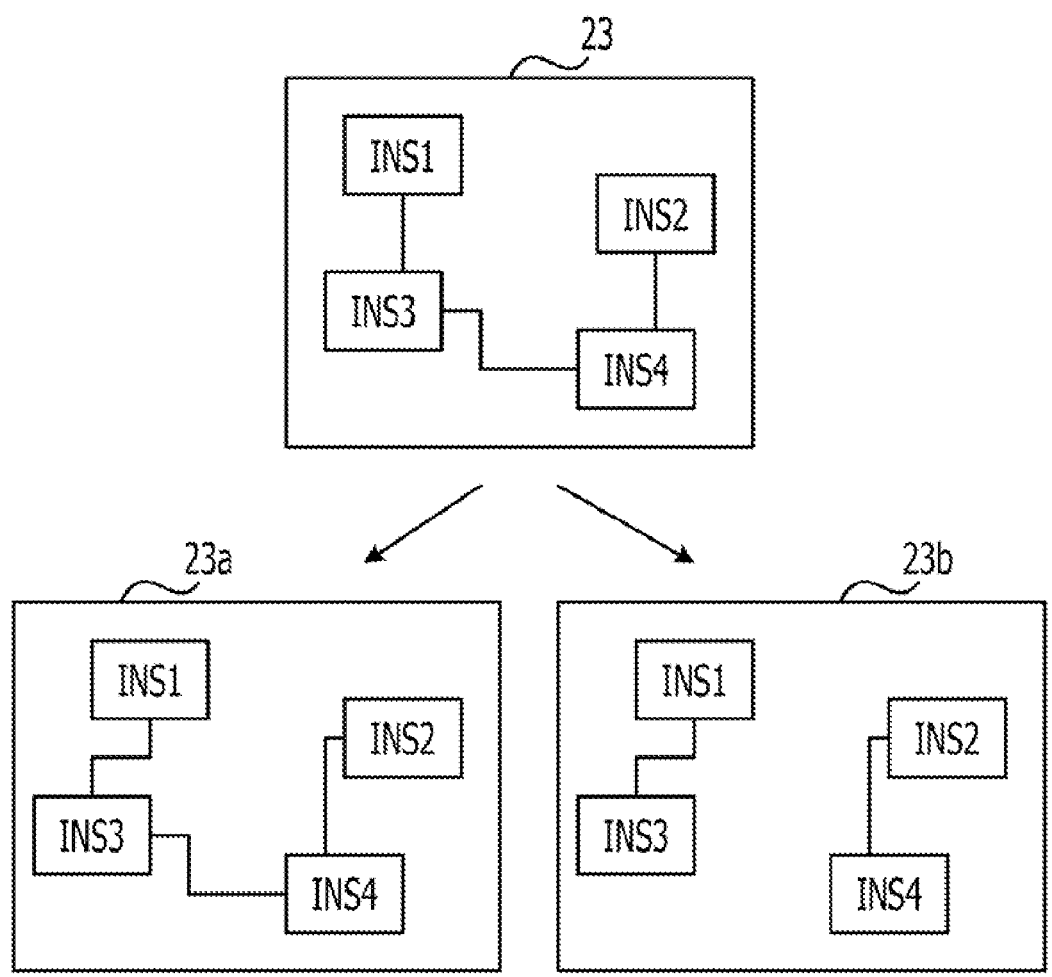
FIG. 9 illustrates a difference of operation of the placement processing unit between the states of a group internal net wiring deletion mode.

FIG. 9 illustrates a difference of operation of the placement processing unit between the setting states of the group internal net wiring deletion mode.

For the convenience of description with reference to FIG. 9, it is assumed that "Net-A (Ins1, Ins3), Net-B (Ins2, Ins4), Net-C (Ins3, Ins4)" is mentioned in the net list.

The circuit block 23a and the circuit block 23b represent cases where the instance Ins3 and an instance Ins4 have been moved from the wiring state of a circuit block 23.

Upon finalization of placement by a user, the wiring state makes a transition to the circuit block 23a or circuit block 23b depending on the setting state of the group internal net wiring deletion mode.

The circuit block 23a represents a processing result in the case where the group internal net wiring deletion mode is set to OFF. In the case where the group internal net wiring deletion mode is set to OFF, the placement processing unit 13 leaves intact the wiring of a net closed in a group without deleting the wiring, upon finalization of the placement position an instance or upon deletion of the instance (upon finally determining that no instance is placed). That is, wiring between the instances Ins3 and Ins4 is left intact without being deleted in the circuit block 23a.

The circuit block 23b represents a processing result in the case where the group internal net wiring deletion mode is set to ON. In the case where the group internal net wiring deletion mode is set to ON, the placement processing unit 13 deletes the wiring of the net closed in the group at the moment when the placement is finalized or when the deletion is finalized. In the circuit block 23b, wiring between the instances Ins3 and Ins4 is deleted. This way enables control in the case where it is desired that the existing wiring be deleted, and in the case where it is desired that new wiring be arranged when an instance is moved to a different location, for example.

Figure 10:
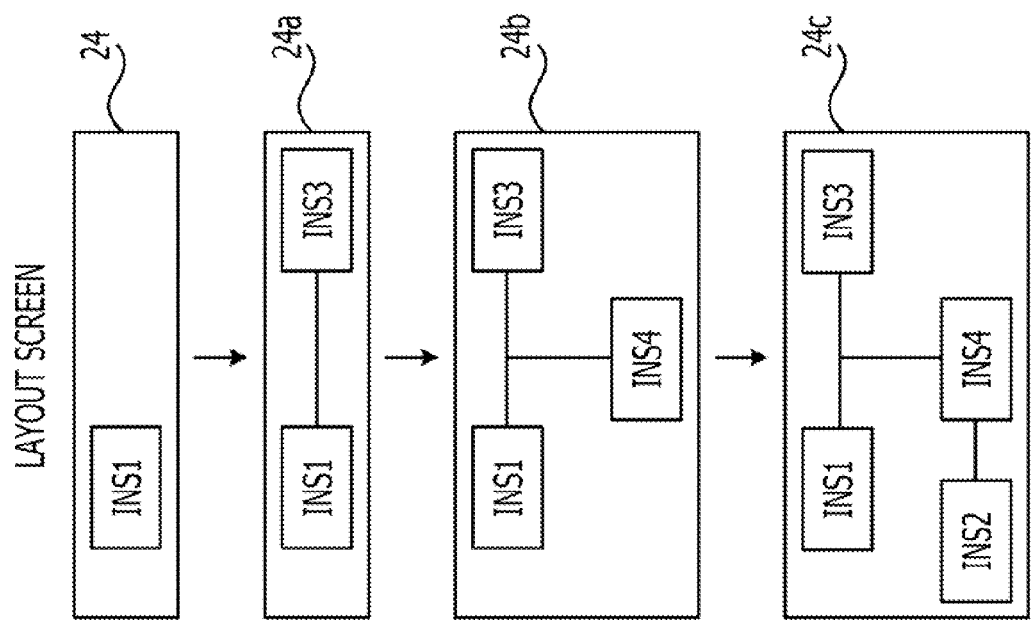
FIG. 10 illustrates operation of the placement processing unit when a pass mode is set.

FIG. 10 illustrates operation of the placement processing unit when the pass mode is set.

For the convenience of description with reference to FIG. 10, it is assumed that "Net-A (Ins1, Ins2, Ins3, Ins4)" is mentioned in the net list.

In cases where the pass mode is selected, the placement processing unit 13 creates wiring every time a cell is placed.

In a circuit block 24, the instance Ins1 is placed as the initial state.

As illustrated in a circuit block 24a, the placement processing unit 13 requests the interactive editor 12 to display wiring that connects the instance Ins1 with the instance Ins3 upon placement of the instance Ins3 by a user.

As illustrated in a circuit block 24b, upon placement of the instance Ins4 by a user, the placement processing unit 13 requests the interactive editor 12 to display wiring that connects the instances Ins1, Ins3, and Ins4 together.

Then, as illustrated in a circuit block 24c, the placement processing unit 13 requests the interactive editor 12 to display wiring that connects the instance Ins2 with the instance Ins4 upon placement of the instance Ins2 by a user. Thus, the instances Ins1 to Ins4 are connected together.

Figure 11:
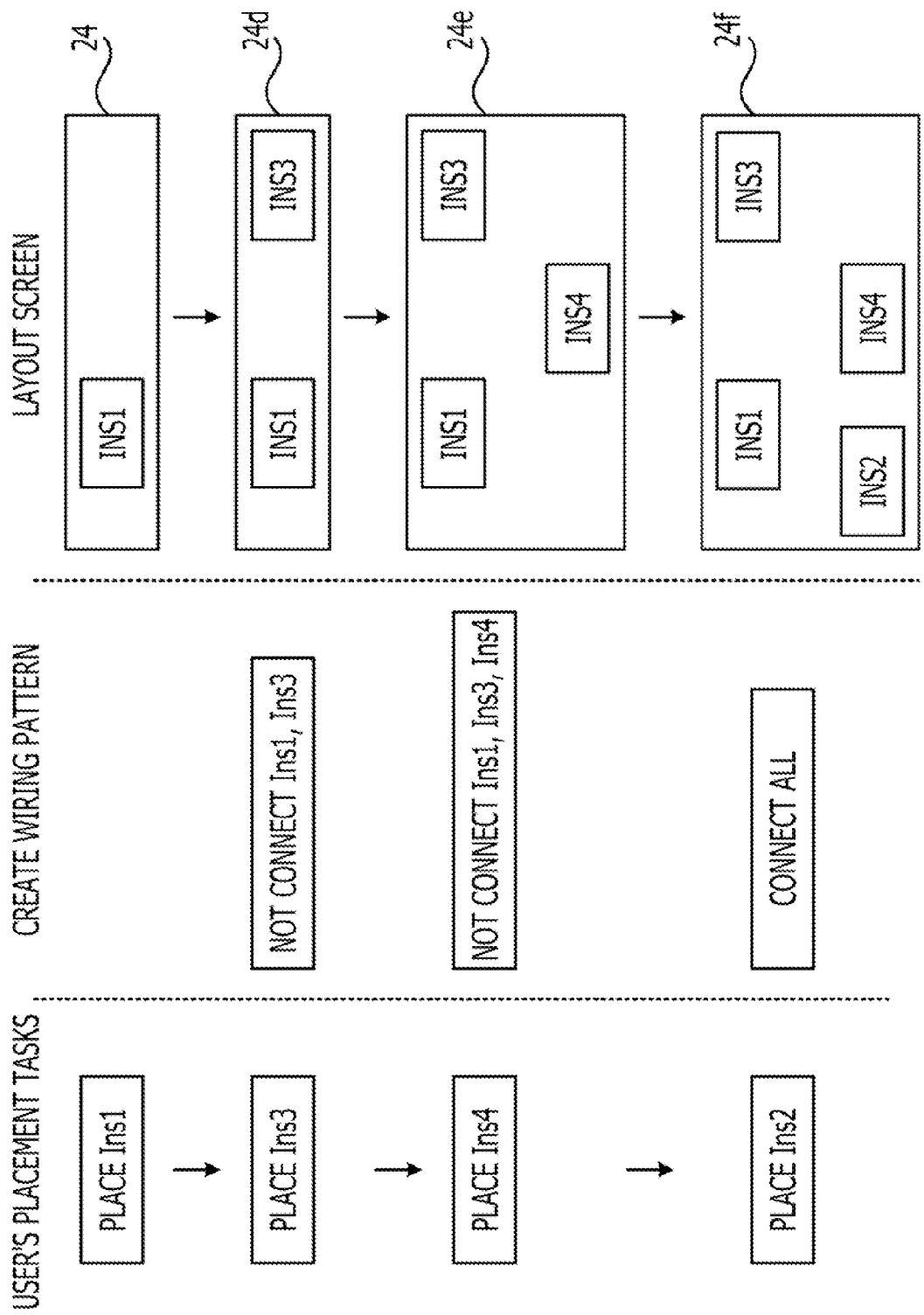
FIG. 11 illustrates operation of the placement processing unit when a net mode is set.

FIG. 11 illustrates operation of the placement processing unit when the net mode is set.

For the convenience of description with reference to FIG. 11, it is assumed that "Net-A (Inst1, Ins2, Ins3, Ins4)" is mentioned in the net list.

In cases where the net mode is selected, the placement processing unit 13 creates wiring after all the cells in a net have been placed.

As illustrated in a circuit block 24d, even upon a placement of the instance Ins3 by a user, the placement processing unit 13 does not connect the instance Inst1 with the instance Ins3.

As illustrated in a circuit block 24e, even upon placement of the instance Ins4 by a user, the placement processing unit 13 does not connect the instances Inst1, Ins3, and Ins4.

Then, as illustrated in a circuit block 24f, the instances Inst1, Ins3, and Ins4 are connected together and the instance Ins2 is connected with the instance Ins4 upon placement of the instance Ins2 by a user. Thus, the instances Inst1 to Ins4 are connected together.

Figure 12:
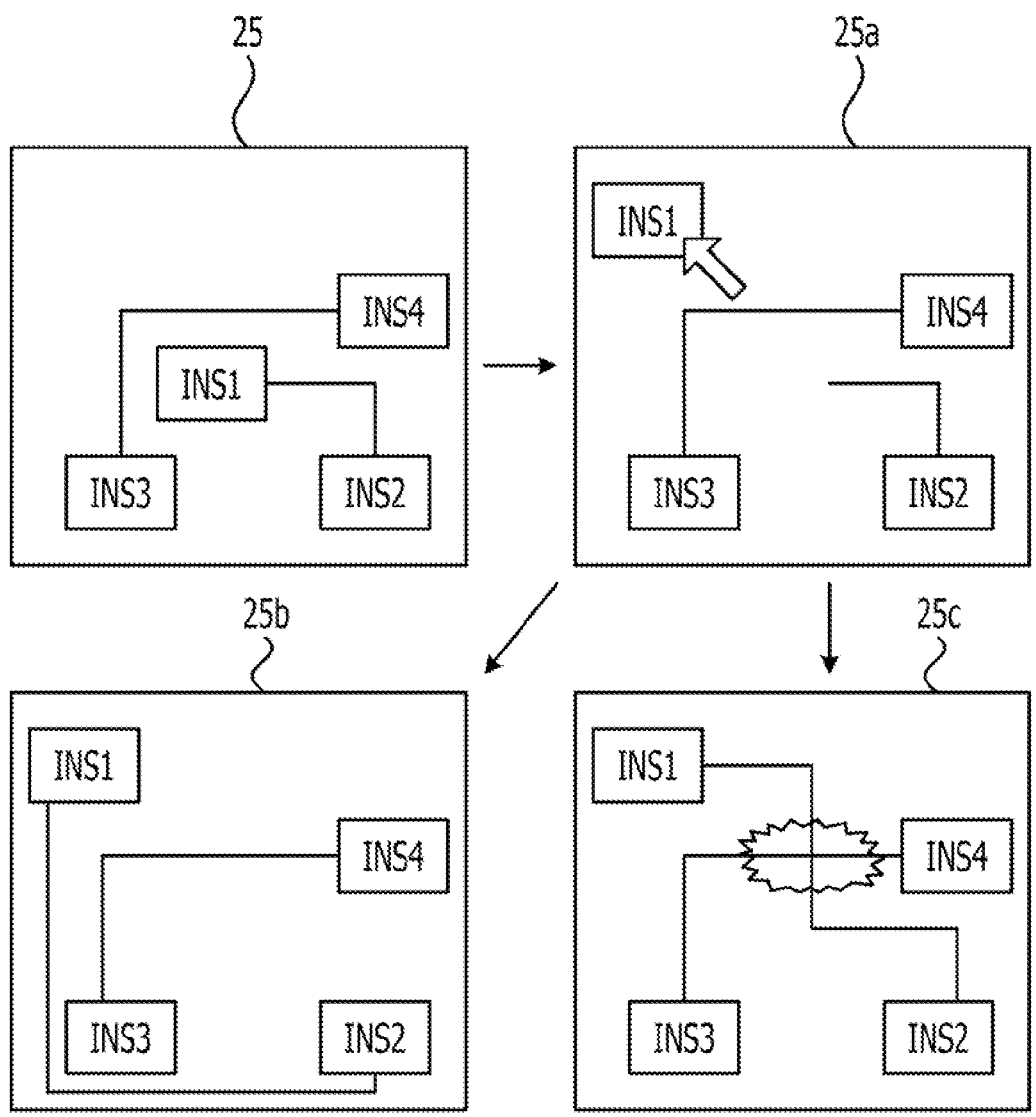
FIG. 12 illustrates a difference of operation of the placement processing unit between the states of a priority wiring mode that is set.

FIG. 12 illustrates a difference of operation of the placement processing unit between the setting states of the priority wiring mode.

For the convenience of description with reference to FIG. 12, it is assumed that "Net-A (Inst1, Ins2), Net-B (Ins3, Ins4)" is mentioned in the net list.

In cases where the priority wiring mode is selected, the placement processing unit 13 controls the highest priority of wiring at the time of creating wiring.

A circuit block 25a represents the case where the instance Inst1 has been moved from the wiring state of a circuit block 25.

Upon finalization of instance placement by a user, the wiring state makes a transition to a circuit block 25b or a circuit block 25c depending on the setting state of the priority wiring mode.

The circuit block 25b represents a processing result in the case where the priority wiring mode of the instance Inst1 is set to OFF.

In the case where the priority wiring mode is set to OFF, wiring takes a detour upon finalization of a placement position. That is, wiring between the instances Ins3 and Ins4 has higher priority than wiring between the instances Inst1 and Ins2.

The circuit block 25c represents a processing result in the case where the priority wiring mode of the instance Inst1 is set to ON.

In the case where the priority wiring mode is set to ON, wiring for the instance Inst1 has the highest priority. That is, wiring is arranged so that the wiring path between the instances Inst1 and Ins2 is the shortest regardless of wiring between the instances Ins3 and Ins4. It is to be noted that, under this condition, there is an overlap between the wiring between the instances Inst1 and Ins2 and the wiring between the instances Ins3 and Ins4, and therefore short-circuiting occurs.

Thus, control over wiring is enabled in cases where it is desired that wiring have the highest priority, for example, because the net is a critical path.

In the following, a method of avoiding short-circuiting of wiring between the instances Inst1 and Ins2 and wiring between the instances Ins3 and Ins4 will be described.

Figure 13:
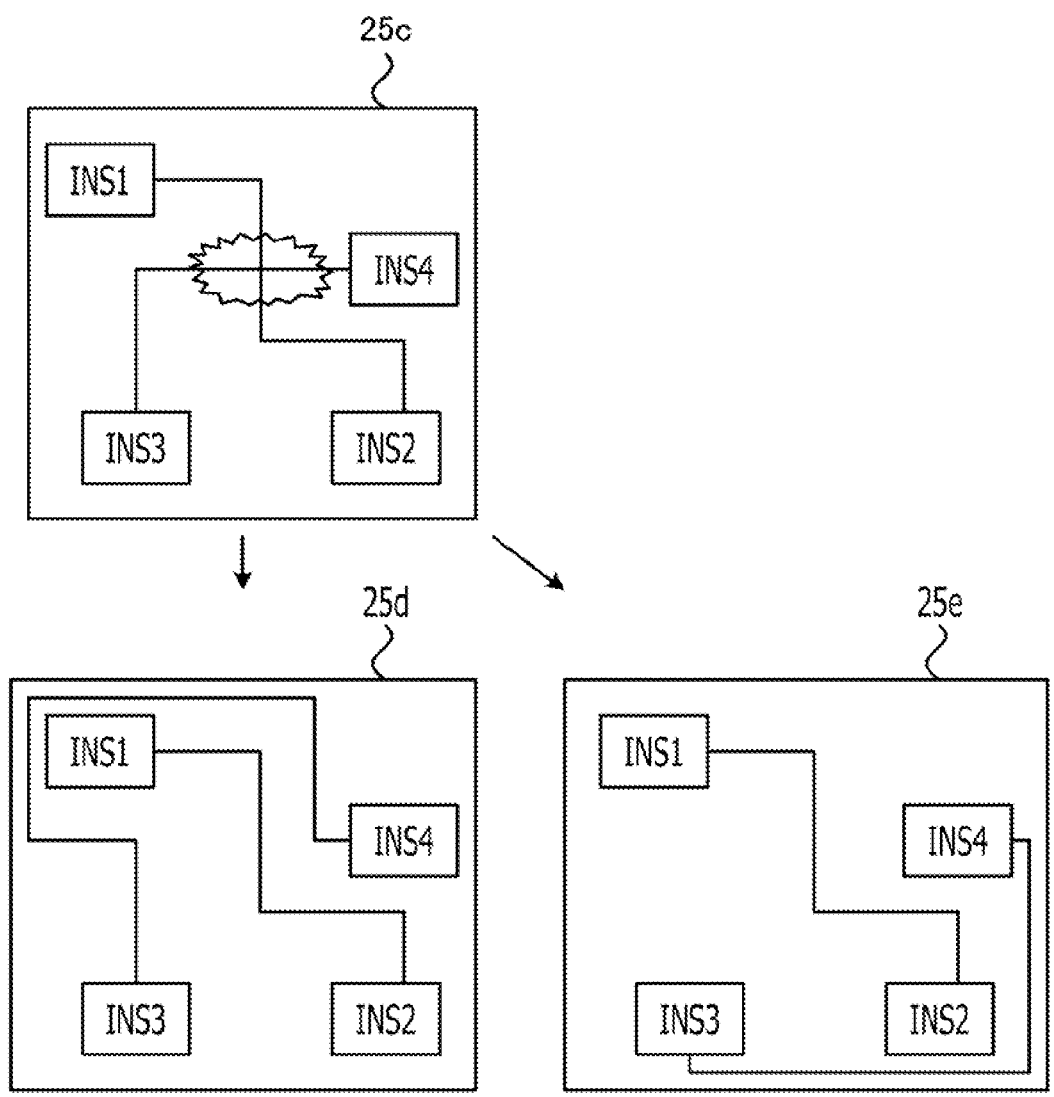
FIG. 13 illustrates a method of avoiding short-circuiting.

FIG. 13 illustrates a method of avoiding short-circuiting of wiring.

Under short-circuiting conditions, a user manually moves wiring of Net-A. Alternatively, the user selects a normal wiring mode and gives an instruction for performing rewiring of Net-A, so that wiring is performed. Thus, short-circuiting is finally avoided.

A circuit block 25d represents a former example, whereas a circuit block 25e represents a latter example.

Figure 14:
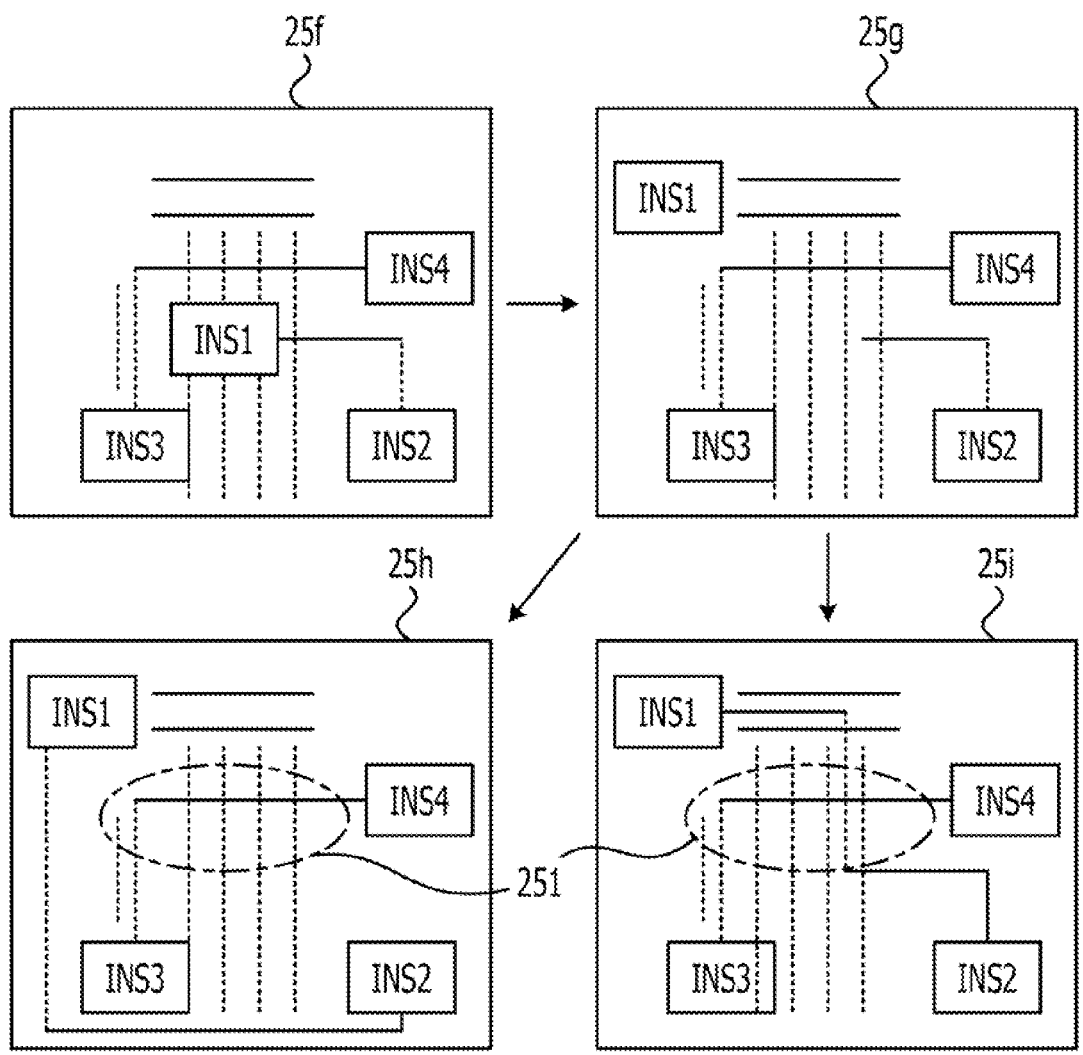
FIG. 14 illustrates a method of avoiding short-circuiting in a plurality of wiring layers.

FIG. 14 illustrates a method of avoiding short-circuiting in a plurality of wiring layers.

In automatic wiring, there are some cases where an empty path is selected to avoid a congested situation (conditions for avoiding congestion are typically controlled with parameters); however, in cases where the priority wiring mode is set to ON, the placement processing unit 13 typically performs wiring in such a manner that the wiring has the highest priority regardless of whether there is a congested portion. At this point, there is a possibility that short-circuiting occurs (short-circuiting cannot be avoided) according to circumstances. If short-circuiting occurs, processing for avoiding short-circuiting can be performed using the method described with reference to FIG. 13.

A circuit block 25f represents the instances Inst1 to Ins4 placed on a double-layer substrate. In FIG. 14, wiring (horizontal line) placed on the upper layer of the substrate is indicated by a solid line, and wiring (vertical line) placed on the lower layer of the substrate is indicated by a dotted line.

A circuit block 25g represents the case where the instance Inst1 has been moved from the wiring state of the circuit block 25f.

Upon finalization of the instance placement by a user, the wiring state makes a transition to a circuit block 25h or a circuit block 25i depending on the setting state of the priority wiring mode.

The circuit block 25h represents a processing result in the case where the priority wiring mode of the instance Inst1 is set to OFF.

In the case where the priority wiring mode is set to OFF, wiring takes a detour upon finalization of a placement position. That is, wiring between the instances Inst1 and Ins2 is arranged so as to avoid a congested area 251 of wiring surrounded by an alternate long and short dash line in the circuit block 25h.

The circuit block 25i represents a processing result in the case where the priority wiring mode of the instance Inst1 is set to ON.

In the case where the priority wiring mode of the instance Inst1 is set to ON, wiring is performed in such a manner that the wiring has the highest priority regardless of whether the congested area 251 surrounded by an alternate long and short dash line is present or absent in the circuit block 25i.

Figure 15:
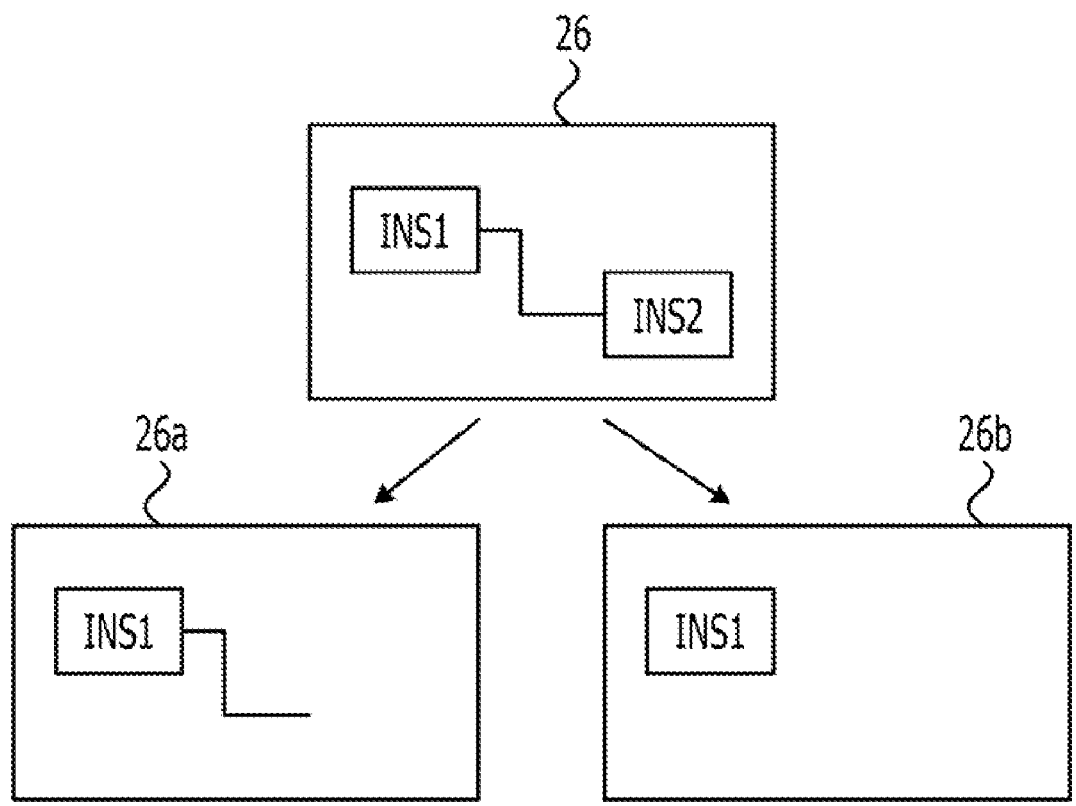
FIG. 15 illustrates a difference of operation of the placement processing unit between the states of a deletion mode that is set.

FIG. 15 illustrates a difference of operation of the placement processing unit between the setting states of the deletion mode.

For the convenience of description with reference to FIG. 15, it is assumed that "Net-A (Inst1, Ins2)" is mentioned in the net list.

In cases where the deletion mode is selected, the placement processing unit 13 performs control over how to handle the currently placed wiring when deleting an instance to return a cell specified by this instance to a state in which no instance is placed.

A circuit block 26a and a circuit block 26b represent cases where the instance Ins2 is deleted from the wiring state of a circuit block 26. And, as a result, a cell specified by the instance Ins2 is returned to the state in which no instance is placed.

A user finalizes a state in which no instance is placed in the cell specified by this instance by deleting an instance, and then the wiring state makes a transition to the circuit block 26a or the circuit block 26b depending on the setting state of the deletion mode.

The circuit block 26a represents a processing result in the case where the deletion mode is set to OFF.

In the case where the deletion mode is set to OFF, if the state in which no instance is placed in the cell specified by this instance is finalized at the time of deletion of the instance Ins2, wiring is left intact without being deleted.

The circuit block 26b represents a processing result in the case where the deletion mode is set to ON.

In the case where the deletion mode is set to ON, wiring is deleted at the moment when the state in which no instance is placed in the cell specified by the instance Ins2 is finalized by deleting this instance.

The deletion mode is enabled when the state in which no instance is placed in the cell specified by the instance is finalized by deleting this instance, in the case where it is desired that the existing wiring be deleted, or in the case where it is desired that new wiring be arranged when an instance is moved to a different location.

Figure 16:
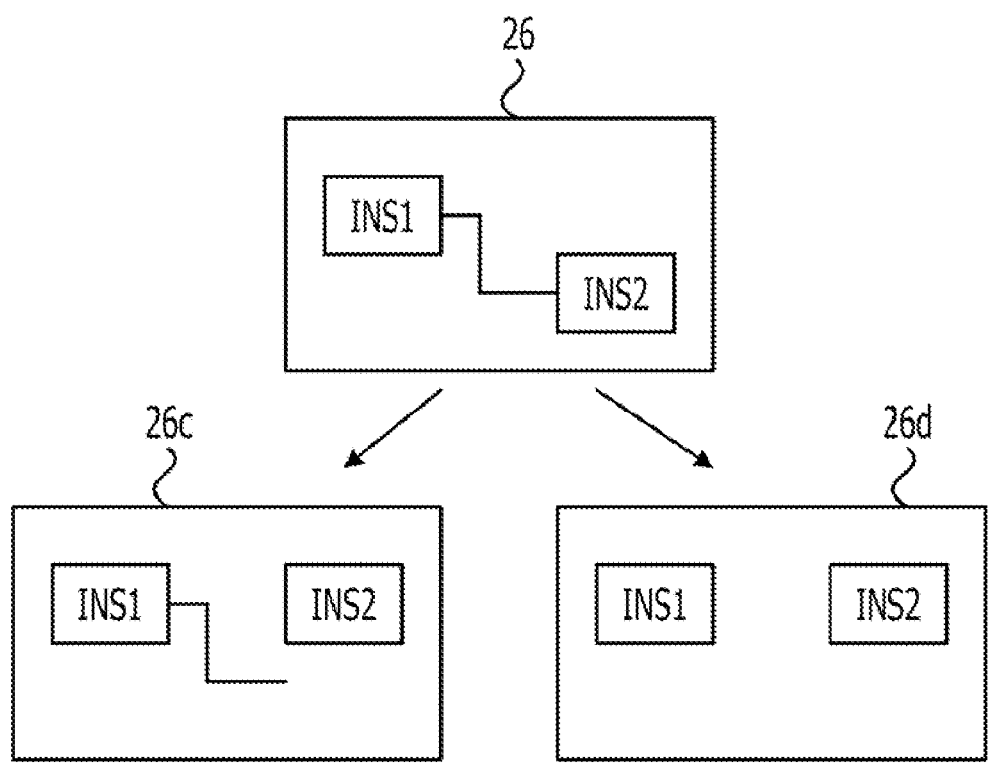
FIG. 16 illustrates a difference of operation of the placement processing unit between the states of the deletion mode that is set.

FIG. 16 illustrates a difference of operation of the placement processing unit between the setting states of the deletion mode.

For the convenience of description with reference to FIG. 16, it is assumed that "Net-A (Inst1, Ins2)" is mentioned in the net list.

A circuit block 26c and a circuit block 26d represent cases where the instance Ins2 has been moved from the wiring state of the circuit block 26.

Upon finalization of the placement movement by a user, the wiring state makes a transition to the circuit block 26c or the circuit block 26d depending on the setting state of the deletion mode.

The circuit block 26c represents a processing result in the case where the deletion mode is set to OFF.

In the case where the deletion mode is set to OFF, wiring is left intact without being deleted upon the finalization of the placement movement.

The circuit block 26d represents a processing result in the case where the deletion mode is set to ON.

In the case where the deletion mode is set to ON, wiring is deleted at the moment when the placement movement is finalized.

Next, an operation example of the placement processing unit 13 in the case where the priority wiring mode is selected on a net-by-net basis.

FIG. 17 illustrates an operation example of the placement processing unit in the case the priority wiring mode is selected on the net-by-net basis.

For the convenience of description with reference to FIG. 17, it is assumed that "Net-A (Inst1-Out, Ins2-In1), Net-B (Ins3-Out, Ins2-In2), Net-C (Ins2-Out, Ins4-In), Net-D (Ins5-Out, Ins6-In)" is mentioned in the net list.

On the individual-net-settings display screen 173a illustrated in FIG. 17, demonstrated is the case where the priority wiring mode is set to ON for a net Net-C connected to the output terminal Out, and the priority wiring mode is set to OFF for the other input terminals In1 and In2.

A circuit block 27a represents a result of operation that the placement processing unit 13 performs when a user moves the instance Ins2 downward in a circuit block 27.

When the user moves the instance Ins2 and finalizes the placement position, the placement processing unit 13 reads in a placement parameter file stored in the placement parameter storage unit 14, and refers to settings on the individual-net-settings display screen 173a.

Then, the placement processing unit 13 confirms that the priority wiring mode of the net Net-A connected to the Input terminal In1 and the priority wiring mode of the net Net-B connected to the input terminal In2 are set to OFF.

The placement processing unit 13 therefore arranges wiring such that wiring between the net Net-A and the net Net-B takes a detour so as not to interfere with other nets.

On the other hand, regarding the net Net-C connected to the output terminal Out, the placement processing unit 13 confirms that the priority wiring mode is set to ON.

Therefore, the placement processing unit 13 gives priority to the net Net-C in wiring.

Thus, control over wiring of a cell that moves can be freely performed for each net connected to a terminal in the cell.

It is to be noted that, with reference to FIGS. 7 to 17, processing for nets has been described; however, substantially similar processing can be performed between terminals.

Processing of the modes that have been described is implemented using the following flowcharts.

Figure 18:
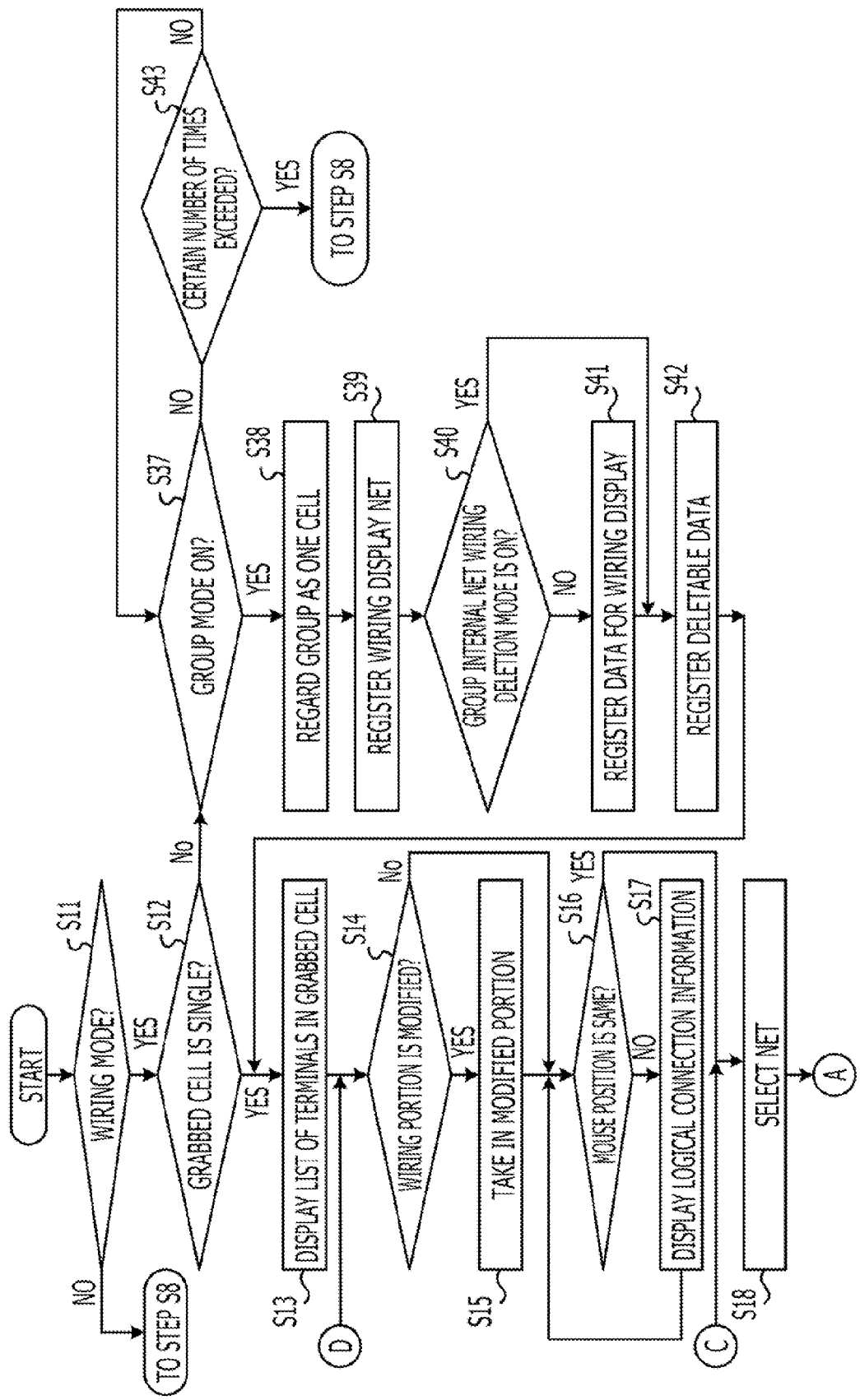
FIG. 18 illustrates a flowchart illustrating the processing of the placement processing unit.
Figure 19:
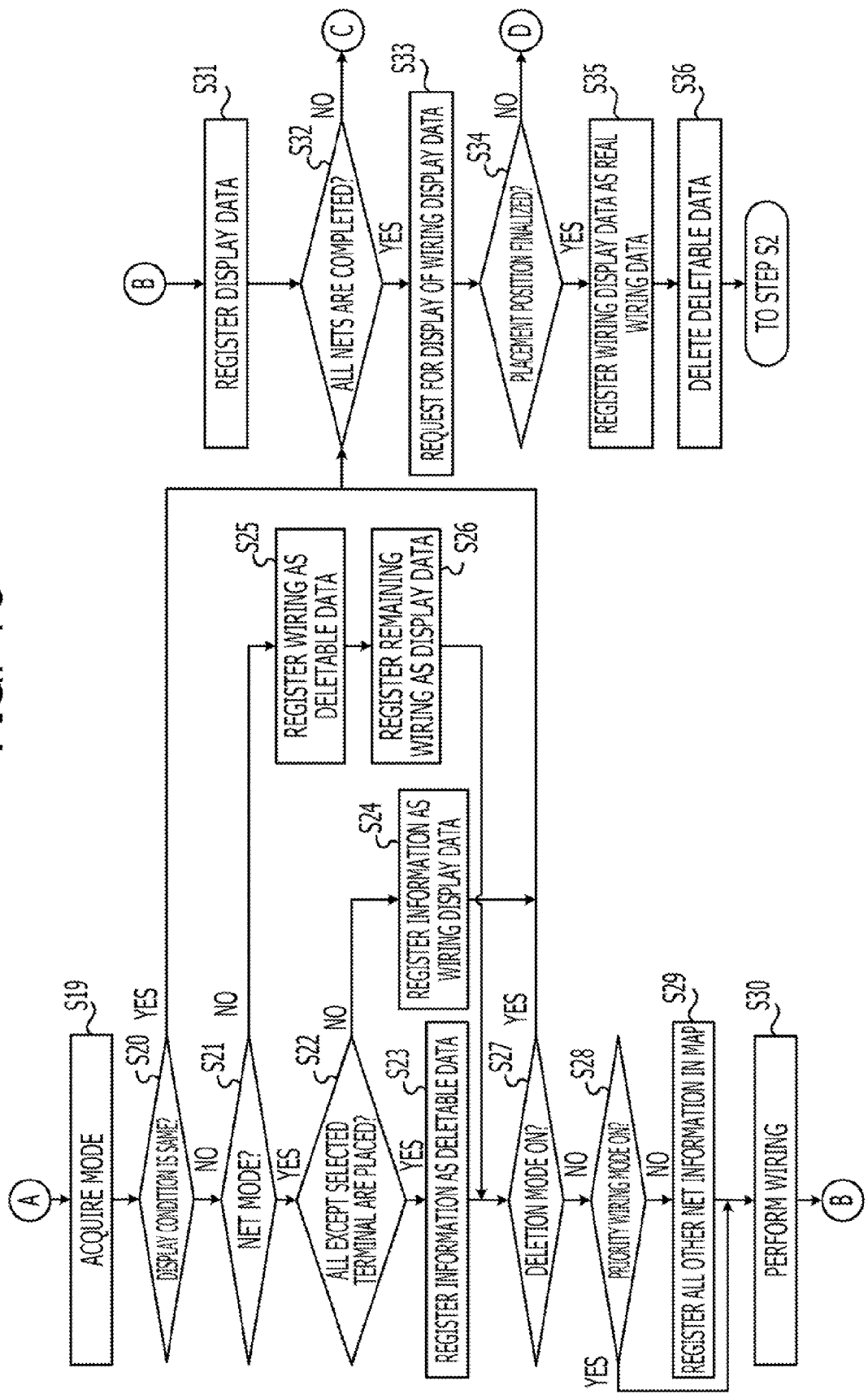
FIG. 19 illustrates a flowchart illustrating the processing of the placement processing unit.

FIG. 18 and FIG. 19 are flowcharts illustrating processing of the placement processing unit in detail.

[Step S11] Referring to a placement parameter file, the placement processing unit 13 determines whether a mode specified by a user is the wiring mode. If the specified mode is the wiring mode (Yes in step S11), then the process moves to step S12. If not (No in step S11), then the placement processing unit 13 performs the processing in step S8 and the subsequent steps illustrated in FIG. 4.

[Step S12] The placement processing unit 13 checks the number of cells selected for placement. If the number of selected cells is single (Yes in step S12), then the process moves to step S13. If the number of selected cells is plural (No in step S12), then the process moves to step S37.

[Step S13] The placement processing unit 13 requests the interactive editor 12 to display a list of nets to which terminals in the grabbed cell belong on the individual-net-settings display screen 173a.

[Step S14] The placement processing unit 13 determines whether a wiring portion of the placement parameter file is modified. Specifically, if a change exists (Yes in step S14), then the process moves to step S15. If this modification of parameters does not include any change from the currently stored state (No in step S14), then the existing parameters are used and therefore the process moves to step S16.

[Step S15] The placement processing unit 13 reads again the placement parameter file from the placement parameter storage unit 14. Then, the process goes to step S16.

[Step S16] The placement processing unit 13 determines whether the position of the grabbed cell, that is, the position of the mouse 105b remains the same for a certain time or more. This is because a candidate position for placement of the cell is a position specified using the mouse 105b.

If the grabbed cell remains at the same position for a certain time or more (Yes in step S16), then the process goes to step S18 to be continued to real wiring processing. If the mouse 105b is moved in less than the certain time (No in step S16), then the process moves to step S17.

[Step S17] The placement processing unit 13 requests the interactive editor 12 to cause the display processing unit 17 to display logical connection information. Then, the process returns to step S16.

In this way, processing in step S16 and processing in step S17 are repeated until the position of the mouse 105b is fixed for a certain time. Thus, if a time during which the position of the mouse 105b is moved is shorter than a time during which processing of creating wiring for display is performed, the interactive editor 12 does not create wiring for display.

In processing in step S18 and the subsequent steps, real wiring is created for the selected net of a terminal in the cell.

[Step S18] The placement processing unit 13 selects the net of the terminal in the grabbed cell. Then, the process goes to step S19.

[Step S19] The placement processing unit 13 acquires the mode and the like of the terminal. Then, the process goes to step S20.

[Step S20] The placement processing unit 13 determines whether the mode selected in step S19 is the same as the previous mode. If the selected mode is the same as the previous mode (Yes in step S20), that is, if the wiring for display has already been created, then that wiring is used as a display candidate. For this reason, processing in step S21 and the subsequent steps will not be performed, and therefore the process moves to step S32. If the selected mode is not the same as the previous mode (No in step S20), that is, if a parameter has been changed, or if the wiring for display does not exist, then the process moves to step S21.

[Step S21] Referring to the placement parameter file, the placement processing unit 13 determines whether the net mode is set to ON. If the net mode is set to ON (Yes in step S21), then the process moves to step S22. If the net mode is set to OFF (No in step S21), that is, if the pass mode is set to ON, then the process moves to step S25.

[Step S22] In the case where the net mode is set to ON, since the net mode is a mode in which wiring is created when all terminals in a net are placed, the placement processing unit 13 checks whether all terminals except the selected terminal in the net are placed. If the terminals are placed (Yes in step S22), then the process moves to step S23. If not (No in step S22), then the process moves to step S24.

[Step S23] In order to create wiring for display, the placement processing unit 13 registers all information on the existing wiring in the net as deletable data, if the existing wiring is present. Then, the process goes to step S27.

[Step S24] Wiring for display is not created, and therefore if the existing wiring is present, the placement processing unit 13 registers all information on the wiring in the net as data for wiring display. Then, the process goes to step S32.

[Step S25] The placement processing unit 13 determines the pass mode. If the existing pass wiring from the selected terminal is present, the placement processing unit 13 registers the wiring as deletable data. Then, the process goes to step S26.

[Step S26] The placement processing unit 13 registers the remaining wiring as data for wiring display, that is, wiring that has not been registered as deletable data. Then, the process goes to step S27.

[Step S27] Referring to the placement parameter file, the placement processing unit 13 determines whether the deletion mode is set to ON. If the deletion mode is set to ON (Yes in step S27), then processing of creating wiring for display is not performed. The process moves to step S32. If the deletion mode is set to OFF (No in step S27), then the process moves to step S28.

[Step S28] Referring to the placement parameter file, the placement processing unit 13 determines whether the priority wiring mode is set to ON. If the priority wiring mode is set to ON (Yes in step S28), then wiring is performed in such a manner that the wiring has the highest priority. Accordingly, other net information is unnecessary and therefore is not registered in a wiring map. The process moves to step S30. If the priority wiring mode is set to OFF (No in step S28), then the process moves to step S29.

[Step S29] The placement processing unit 13 registers other net information in the wiring map. Then, the process goes to step S30.

[Step S30] The placement processing unit 13 sends the placement information of the terminal and the like to a wiring processing phase and performs wiring. Then, the process goes to step S31.

[Step S31] The placement processing unit 13 registers, as data for wiring display, the wiring created in step S30. Then, the process goes to step S32.

[Step S32] The placement processing unit 13 checks whether processing of all terminals of the selected instance have been performed. If processing of all the terminals has been performed (Yes in step S32), then the process moves to step S33. If processing of all the terminals has not been performed (No in step S32), then the process moves to step S18.

[Step S33] The placement processing unit 13 requests the interactive editor 12 to cause the display processing unit 17 to display data registered as the data for wiring display.

[Step S34] The placement processing unit 13 confirms the data displayed in step S33 to check whether the placement position has been finalized. If the placement position has been finalized (Yes in step S34), then the process moves to step S35. If the placement position has not been finalized (No in step S34), then the process moves to step S14.

[Step S35] The placement processing unit 13 registers the data for wiring display as real wiring data. Then, the process goes to step S36.

[Step S36] The placement processing unit 13 deletes data stored as deletable data. Then, the placement processing unit 13 performs the processing of step S2 and the subsequent steps illustrated in FIG. 4.

[Step S37] The placement processing unit 13 checks whether the group mode is set to ON. If the group mode is set to ON (Yes in step S37), the process moves to step S38. If the group mode is set to OFF (No in step S37), the process moves to step S43.

[Step S38] The placement processing unit 13 regards a plurality of cells in a group as one cell. Then, the process goes to step S39.

[Step S39] The placement processing unit 13 handles a terminal having a connection to the outside of the group, as a terminal of the cell, and registers an internal net as a net for wiring display.

This group cell differs from a single cell in that an internal net exists in the group cell. In cases where there is wiring for the internal net, processing differs from each other according to the setting state of the group internal net wiring deletion mode.

[Step S40] Referring to the placement parameter file, the placement processing unit 13 determines whether the group internal net wiring deletion mode is set to ON. If the group internal net wiring deletion mode is set to ON (Yes in step S40), then the process moves to step S42. If the group internal net wiring deletion mode is set to OFF (No in step S40), then the process moves to step S41.

[Step S41] The placement processing unit 13 registers wiring information of the internal net as data for wiring display. Then, the process goes to step S42.

[Step S42] The placement processing unit 13 registers wiring information of the internal net as deletable data. Then, the process goes to step S13.

[Step S43] The placement processing unit 13 does not enter a process of creating wiring for display and checks the number of times the process has moved to step S43. If the number of times does not exceed a certain number of times (No in step S43), then the process returns to step S37. If the number of times exceeds the certain number of times (Yes in step S43), then the processing in step S8 and the subsequent steps of FIG. 4 is performed.

Thus, the description of the flowcharts is completed.

As such, wiring data for display and wiring data for deletion are registered in advance, which allows reduction in loads of the interactive editor 12.

As described above, a wiring phase is introduced into a placement phase of the interactive editor 12 of the design support apparatus 10, which makes it possible to create and refer to wiring for an object to be placed.

Specifically, wiring is completed when the placement processing unit 13 has placed the final cell in a net in the case where the router mode is set to ON. This eliminates an opportunity of giving a wiring instruction after the cell has been placed. This allows for the work of a designer to be saved.

Moreover, the arrangement of wiring is displayed before the final cell in the net is placed in the case where the router mode is set to ON. The arrangement of wiring can therefore be confirmed while placement of the wiring is under examination. This allows for the work of a designer to be saved.

Moreover, in the case where the priority wiring mode is set to ON, placement of wiring for a cell to be placed has priority over that of other wiring, then a wiring result that is not affected by other wiring can be obtained when rewiring for a net of the priority wiring is performed.

As described above, a design support apparatus, a control method, and a control program of the invention has been described on the basis of embodiments illustrated in the drawings. However, the invention is not limited to the embodiments, and configurations of components may be replaced by those of arbitrary configurations having similar functions. Other arbitrary structures and processes may be added to the invention.

Moreover, the invention may be a combination of two or more of any structures (features) in the above-described embodiments.

It is to be noted that the foregoing processing functions can be implemented by using a computer. In this case, a program comprising a description of processing of functions that the design support apparatus 10 is to have is provided. The program is executed by the computer, so that the foregoing processing functions are performed on the computer. The program in which processing is described can be recorded on a computer-readable recording medium. Examples of the computer-readable recording medium include magnetic storage devices, optical discs, magneto-optical recording media, and semiconductor memories. Examples of the magnetic storage devices include HDD (hard disc drives), FD (flexible discs), and magnetic tapes. Examples of the optical discs include DVD (Digital Versatile Disk), DVD-RAM (Digital Versatile Disk Random Access Memory), and CD-ROM/RW (Compact Disk Read Only Memory/ReWritable). Examples of the magneto-optical recording media include MO (Magneto-Optical) discs.

The program is distributed by selling portable recording media, such as DVDs and CD-ROMs, for example, on which the program is recorded. Also, the program can be stored in a storage device of a server computer and transferred from the server computer to other computers over a network.

The computer that executes the program stores in its own storage device, for example, a program recorded on a portable recording medium or a program transferred from a server computer. The computer then reads the program from its own storage device and performs processing according to the program. It is to be noted that the computer may read a program directly from a portable recording medium and perform processing according to the program. Further, every time a program is transferred from a server computer connected to the computer via a network, the computer may perform processing according to the received program.

At least part of the foregoing processing functions may be implemented using an electronic circuit, such as DSP (Digital Signal Processor), ASIC (Application Specific Integrated Circuit), or PLD (Programmable Logic Device).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A design support apparatus that supports designing of a circuit and is connected to a display unit, the design support apparatus comprising:
    a storage unit that stores logical connection information of the circuit and cell information of a plurality of cells included in the circuit;
    a selection unit that selects target cell information of a cell to be placed out of the cell information stored in the storage unit;
    a placement unit that provisionally places the cell corresponding to the selected target cell information based on inputted positional information;
    a determination unit that determines whether a wiring mode is set;
    a wiring unit that provisionally arranges wiring connected to the provisionally placed cell when the determination unit determines that the wiring mode is set and enables selection of the wiring from a plurality of wirings; and
    a finalization unit that finalizes a position of the wiring provisionally arranged based on finalization of a position of the cell provisionally placed.

2. The design support apparatus according to claim 1, wherein the wiring unit does not treat wiring data of the arranged wiring connected to the cells, except for the cell corresponding to the selected target cell information, as display data to be displayed on the display unit when all of the plurality of cells except the cell corresponding to the selected target cell information are placed.

3. The design support apparatus according to claim 1, wherein the wiring unit treats wiring data of the arranged wiring connected to the cells, except for the cell corresponding to the selected target cell information, as display data to be displayed on the display unit when all of the plurality of cells except the cell corresponding to the selected target cell information are not placed.

4. The design support apparatus according to claim 1, wherein the wiring unit does not treat wiring data of the arranged wiring connected to the cells each time the provisionally arranged wiring is connected to the cell corresponding to the selected target cell information.

5. The design support apparatus according to claim 1, wherein the wiring unit treat wiring data of a wiring, except for the arranged wiring connected to the cells, each time the provisionally arranged wiring is connected to the cell corresponding to the selected target cell information.

6. The design support apparatus according to claim 1, wherein the wiring unit provisionally arranges wiring to the provisionally placed cell so that the provisionally arranged wiring overlaps an existing wiring.

7. The design support apparatus according to claim 1, further comprising a logical connection information display unit that displays logical connection information of the provisionally arranged wiring connected to the provisionally placed cell when the determination unit determines that the wiring mode is not set.

8. The design support apparatus according to claim 1, wherein
    the determination unit further determines whether the selected target cell information includes a plurality of cells and whether the plurality of cells corresponding to the selected target cell information are grouped when the determination unit determines that the wiring mode is set, and
    the wiring unit determines whether to treat wiring data of the arranged wiring connected to the cells and whether to display the arranged wiring connected to the cells on the display unit when the determination unit determines that the selected target cell information includes a plurality of cells and the plurality of cells corresponding to the selected target cell information are grouped.

9. The design support apparatus according to claim 1, wherein the placement unit provisionally places the cell corresponding to the selected target cell information when the provisionally placed cell exists at one place for a certain time and the determination unit determines that the wiring mode is set.

10. A design support method for a design support apparatus that supports designing of a circuit that includes a storage unit that stores logical connection information of the circuit and cell information of a plurality of cells included in the circuit, and is connected to a display unit, the design support method comprising:
    selecting, using a computer, target cell information of a cell to be placed out of the cell information stored in the storage unit;

placing provisionally the cell corresponding to the selected target cell information based on inputted positional information;

determining whether a wiring mode is set;

arranging provisionally wiring connected to the provisionally placed cell when the determining determines that the wiring mode is set;

enabling selection of the wiring from a plurality of wirings; and finalizing a position of the wiring provisionally arranged based on finalization of a position of the cell provisionally placed.

11. A non-transitory computer-readable medium storing a design support program for directing a computer that includes a storage unit storing logical connection information of a circuit and cell information of a plurality of cells included in the circuit and is connected to a display unit, to execute a procedure for supporting designing of a circuit, the procedure comprising:

selecting target cell information of a cell to be placed out of the cell information stored in the storage unit;

placing provisionally the cell corresponding to the selected target cell information based on inputted positional information;

determining whether a wiring mode is set;

arranging provisionally wiring connected to the provisionally placed cell when the determining determines that the wiring mode is set;

enabling selection of the wiring from a plurality of wirings; and finalizing a position of the wiring provisionally arranged based on finalization of a position of the cell provisionally placed.

* * * * *